US012701848B2

(12) United States Patent
Chu et al.

(10) Patent No.: US 12,701,848 B2
(45) Date of Patent: Aug. 4, 2026

(54) DISPLAY DEVICE

(71) Applicant: Samsung Display Co., Ltd., Yongin-si (KR)

(72) Inventors: Seung Jin Chu, Yongin-si (KR); Dong Woo Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 622 days.

(21) Appl. No.: 18/155,592

(22) Filed: Jan. 17, 2023

(65) Prior Publication Data

US 2023/0317766 A1 Oct. 5, 2023

(30) Foreign Application Priority Data

Apr. 4, 2022 (KR) ........................ 10-2022-0041730

(51) Int. Cl.
| | |
|---|---|
| *H10H 29/14* | (2025.01) |
| *H10H 20/821* | (2025.01) |
| *H10H 20/831* | (2025.01) |
| *H10H 20/84* | (2025.01) |

(52) U.S. Cl.
CPC ........ *H10H 29/142* (2025.01); *H10H 20/821* (2025.01); *H10H 20/831* (2025.01); *H10H 20/84* (2025.01)

(58) Field of Classification Search
CPC . H01L 25/0753; H01L 25/167; H10H 20/819; H10H 20/821; H10H 20/831; H10H 20/8314; H10H 20/84; H10H 20/857; H10H 29/142
See application file for complete search history.

(56) References Cited

U.S. PATENT DOCUMENTS

| | | | |
|---|---|---|---|
| 2018/0019369 A1* | 1/2018 | Cho ........................ | H05K 1/181 |
| 2021/0242380 A1* | 8/2021 | Kim ..................... | H10H 20/833 |

FOREIGN PATENT DOCUMENTS

| | | |
|---|---|---|
| KR | 10-2021-0055831 A | 5/2021 |
| KR | 10-2021-0103602 A | 8/2021 |

* cited by examiner

*Primary Examiner* — Andres Munoz
(74) *Attorney, Agent, or Firm* — Womble Bond Dickinson (US) LLP

(57) ABSTRACT

A display device includes a lower electrode, middle electrodes above the lower electrode, and spaced apart from each other, upper electrodes above the middle electrodes, and spaced apart from each other, light emitting elements between the upper electrodes, and connection electrodes above the light emitting elements, and electrically connected to the light emitting elements.

10 Claims, 12 Drawing Sheets

DISPLAY DEVICE

CROSS-REFERENCE TO RELATED APPLICATION

This application claims priority to, and the benefit of, Korean Patent Application No. 10-2022-0041730 filed in the Korean Intellectual Property Office on Apr. 4, 2022, the entire contents of which are incorporated herein by reference.

BACKGROUND

1. Field

The present disclosure relates to a display device.

2. Description of the Related Art

Recently, interest in information display has been increasing. Accordingly, research and development on display devices are continuously being conducted.

SUMMARY

An aspect of the present disclosure provides a display device capable of improving alignment efficiency of light emitting elements.

The present disclosure is not limited to the above aspect, and other aspects that are not mentioned herein will be clearly understood by those of ordinary skill in the art from the following description.

A display device according to one or more embodiments of the present disclosure includes a lower electrode, middle electrodes above the lower electrode, and spaced apart from each other, upper electrodes above the middle electrodes, and spaced apart from each other, light emitting elements between the upper electrodes, and connection electrodes above the light emitting elements, and electrically connected to the light emitting elements.

An interval between the middle electrodes may be less than a length of the light emitting elements.

An interval between the upper electrodes may be greater than a length of the light emitting elements.

The light emitting elements may overlap the lower electrode.

The display device may further include a first insulating layer between the lower electrode and the middle electrodes.

The display device may further include a second insulating layer between the middle electrodes and the upper electrodes.

The display device may further include a third insulating layer above the upper electrodes.

The light emitting elements may be above the third insulating layer.

The display device may further include a fourth insulating layer above the light emitting elements.

The connection electrodes may be above end portions of the light emitting elements exposed by the fourth insulating layer.

A display device according to one or more other embodiments of the present disclosure includes a lower electrode, a first middle electrode and a second middle electrode above the lower electrode and spaced apart from each other, a first upper electrode above the first middle electrode, a second upper electrode above the second middle electrode, and light emitting elements between the first upper electrode and the second upper electrode in plan view.

The first middle electrode may overlap first end portions of the light emitting elements, and wherein the second middle electrode overlaps second end portions of the light emitting elements.

The first middle electrode and the second middle electrode may be at a same layer.

The first upper electrode and the second upper electrode may be at a same layer.

The lower electrode may be configured to receive a first alignment signal.

The first middle electrode may be configured to receive a second alignment signal.

The second middle electrode may be configured to receive the second alignment signal.

The first upper electrode and the second upper electrode may be configured to receive the first alignment signal.

The second middle electrode may be configured to receive the first alignment signal.

The first upper electrode may be configured to receive the first alignment signal, and wherein the second upper electrode is configured to receive the second alignment signal.

Matters of other embodiments are included in the detailed description and drawings.

DETAILED DESCRIPTION

Figures 1, 2:
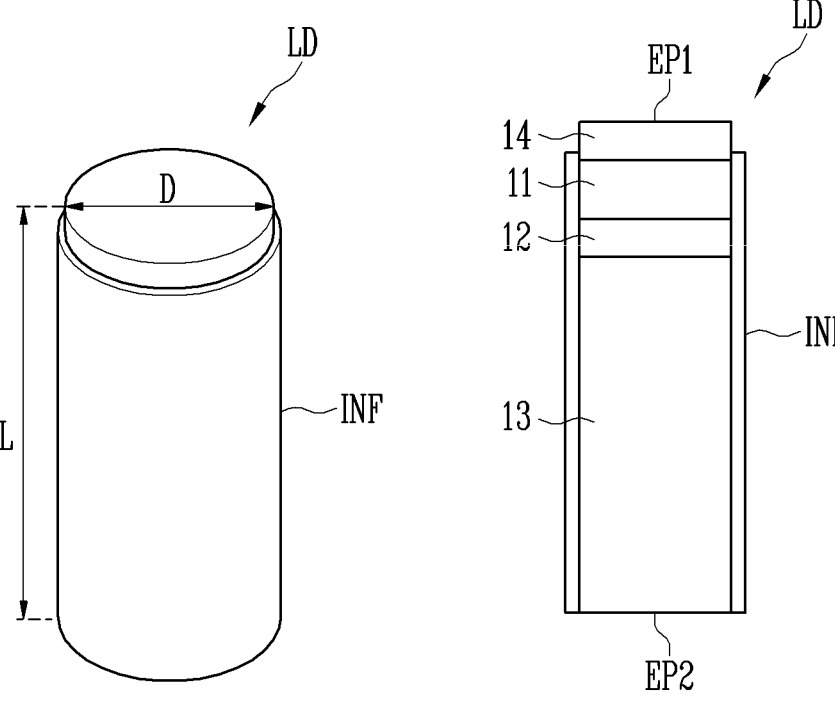
FIG. 1 is a perspective view illustrating a light emitting element according to one or more embodiments.
FIG. 2 is a cross-sectional view illustrating the light emitting element according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" may include A, B, or A and B. As used herein, "or" generally means "and/or," and the term "and/or" includes any and all combinations of one or more of the associated listed items. For example, the expression, such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view illustrating a light emitting element according to one or more embodiments. FIG. 2 is a cross-sectional view illustrating the light emitting element according to one or more embodiments. Although a pillar-shaped light emitting element LD is illustrated in FIGS. 1 and 2, the type and/or shape of the light emitting element LD is not limited thereto.

Referring to FIGS. 1 and 2, the light emitting element LD may include a first semiconductor layer 11, an active layer 12, a second semiconductor layer 13, and/or an electrode layer 14.

The light emitting element LD may be formed in a pillar shape extending in one direction. The light emitting element LD may have a first end portion EP1 and a second end portion EP2. One of the first and second semiconductor layers 11 and 13 may be located in the first end portion EP1 of the light emitting element LD. The other of the first and second semiconductor layers 11 and 13 may be located in the second end portion EP2 of the light emitting element LD. For example, the first semiconductor layer 11 may be located in the first end portion EP1 of the light emitting element LD, and the second semiconductor layer 13 may be located in the second end portion EP2 of the light emitting element LD.

In some embodiments, the light emitting element LD may be a light emitting element manufactured in a pillar shape through an etching method or the like. In this specification, the pillar shape encompasses a rod-like shape or a bar-like shape with an aspect ratio greater than 1, such as a cylinder or a polyprism, and the shape of the cross-section thereof is limited.

The light emitting element LD may have a size as small as a nanometer scale to a micrometer scale. As an example, each of the light emitting elements LD may have a diameter D (or width) and/or a length L in a range of a nanometer scale to a micrometer scale. However, the size of the light emitting element LD is not limited thereto, and the size of the light emitting element LD may vary depending on design conditions of various devices, for example, display devices, in which a light emitting device using the light emitting element LD is used as a light source.

The first semiconductor layer 11 may be a semiconductor layer of a first conductivity type. For example, the first semiconductor layer 11 may include a p-type semiconductor layer. For example, the first semiconductor layer 11 may include at least one semiconductor material selected from InAlGaN, GaN, AlGaN, InGaN, or AlN, and may include a p-type semiconductor layer doped with a first conductivity type dopant, such as Mg. However, a material constituting the first semiconductor layer 11 is not limited thereto, and various other materials may be used to form the first semiconductor layer 11.

The active layer 12 may be located between the first semiconductor layer 11 and the second semiconductor layer 13. The active layer 12 may include one of a single well structure, a multi-well structure, a single quantum well structure, a multi quantum well (MQW) structure, a quantum dot structure, or a quantum wire structure, but is limited thereto. The active layer 12 may include GaN, InGaN, InAlGaN, AlGaN, or AlN, and various materials may constitute the active layer 12.

When a voltage equal to or greater than a threshold voltage is applied to both ends of the light emitting element LD, the light emitting element LD emits light while electron-hole pairs are recombined in the active layer 12. By controlling the light emission of the light emitting element LD using this principle, the light emitting element LD can be used as the light source of various light emitting devices including pixels of a display device.

The second semiconductor layer 13 may be located on the active layer 12, and may include a semiconductor layer of a different type from that of the first semiconductor layer 11. The second semiconductor layer 13 may include an n-type semiconductor layer. For example, the second semiconductor layer 13 may include one semiconductor material selected from InAlGaN, GaN, AlGaN, InGaN, or AlN, and may include an n-type semiconductor layer doped with a second conductivity type dopant, such as Si, Ge, or Sn. However, a material constituting the second semiconductor layer 13 is not limited thereto, and various other materials may be used to form the second semiconductor layer 13.

The electrode layer 14 may be located on the first end portion EP1 and/or the second end portion EP2 of the light emitting element LD. FIG. 2 illustrates a case in which the electrode layer 14 is formed on the first semiconductor layer 11, but the present disclosure is not necessarily limited thereto. For example, a separate electrode layer may be further located on the second semiconductor layer 13.

The electrode layer 14 may include a transparent metal or a transparent metal oxide. For example, the electrode layer 14 may include at least one of indium tin oxide (ITO), indium zinc oxide (IZO), and zinc tin oxide (ZTO), but the present disclosure is not necessarily limited thereto. As such, when the electrode layer 14 includes a transparent metal or a transparent metal oxide, light generated in the active layer 12 of the light emitting element LD may be emitted to the outside of the light emitting element LD through the electrode layer 14.

An insulating film INF may be provided on the surface of the light emitting element LD. The insulating film INF may be directly located on the surfaces of the first semiconductor layer 11, the active layer 12, the second semiconductor layer 13, and/or the electrode layer 14. The insulating film INF may expose the first and second end portions EP1 and EP2 of the light emitting element LD having different polarities. In some embodiments, the insulating film INF may expose side portions of the electrode layer 14 and/or the second semiconductor layer 13 adjacent to the first and second end portions EP1 and EP2 of the light emitting element LD.

The insulating film INF may reduce or prevent the likelihood of an electrical short that may occur when the active layer 12 comes into contact with a conductive material other than the first and second semiconductor layers 11 and 13. In addition, the insulating film INF may reduce or minimize surface defects of the light emitting element LD, thereby improving lifespan and luminescence efficiency of the light emitting elements LD.

The insulating film INF may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). For example, the insulating film INF may include a double layer, and the respective layers constituting the double layer may include different materials. For example, the insulating film INF may include a double layer including aluminum oxide ($AlO_x$) and silicon oxide ($SiO_x$), but the present disclosure is not necessarily limited thereto. In some embodiments, the insulating film INF may be omitted.

The light emitting device including the light emitting element LD described above may be used in various types of devices requiring a light source, including a display device. For example, the light emitting elements LD may be located in each pixel of the display panel, and the light emitting elements LD may be used as a light source of each pixel. However, the field of application of the light emitting element LD is not limited to the above-described example. For example, the light emitting element LD may also be used in other types of devices that require a light source, such as a lighting device.

Figure 3:
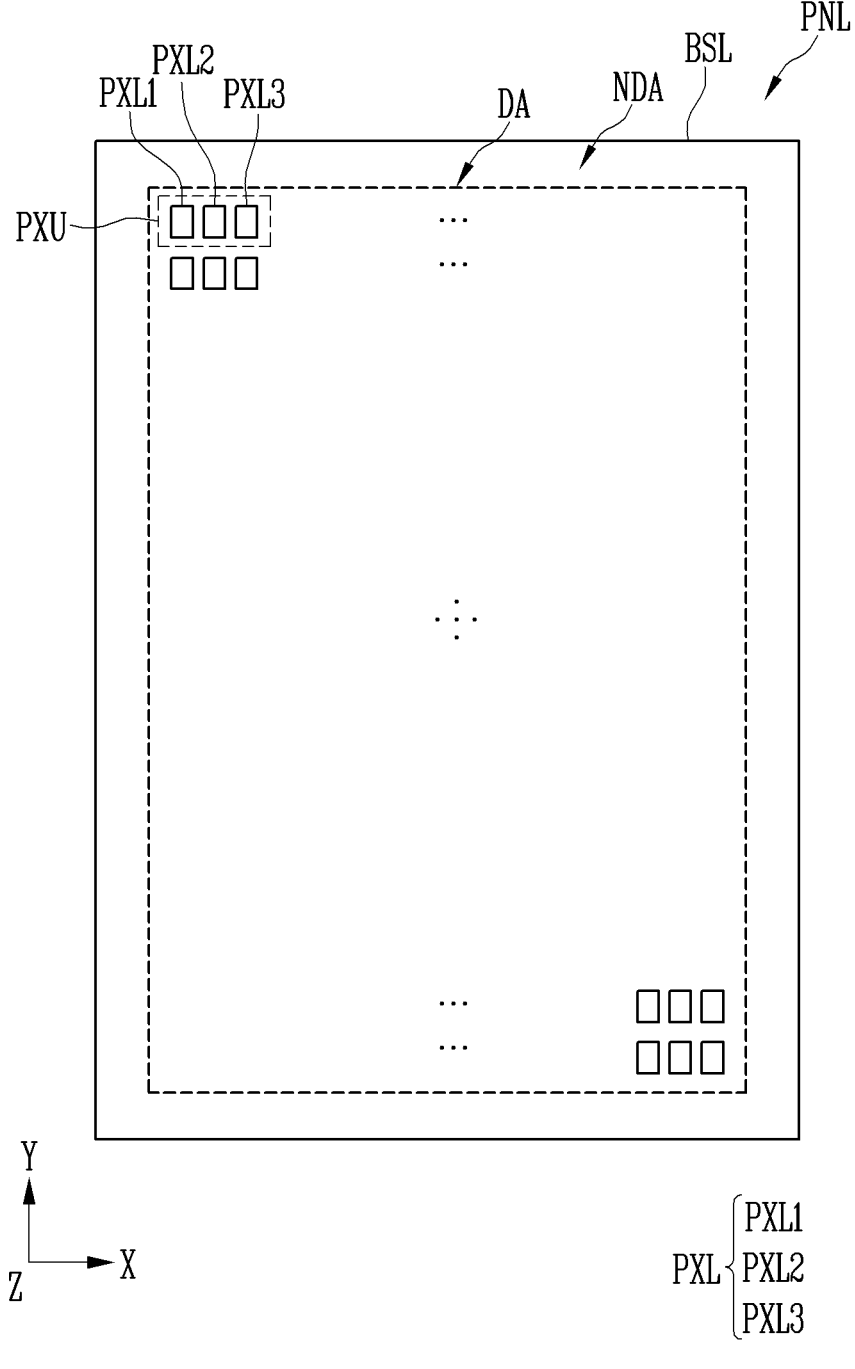
FIG. 3 is a plan view illustrating a display device according to one or more embodiments.

FIG. 3 is a plan view illustrating a display device according to one or more embodiments.

FIG. 3 illustrates a display device, for example, a display panel PNL provided in the display device, as an example of an electronic device that can use the light emitting element LD described in the embodiments of FIGS. 1 and 2 as the light source.

For convenience of description, the structure of the display panel PNL is briefly illustrated focusing on a display area DA in FIG. 3. However, according to one or more embodiments, at least one driving circuit part (e.g., at least one of a scan driver and a data driver), wires, and/or pads may be further located on the display panel PNL.

Referring to FIG. 3, the display panel PNL, and a base layer BSL for forming the display panel PNL, may include a display area DA for displaying an image and a non-display area NDA excluding the display area DA. The display area DA may constitute a screen on which an image is displayed, and the non-display area NDA may be an area other than the display area DA.

A pixel unit PXU may be located in the display area DA. The pixel unit PXU may include a first pixel PXL1, a second pixel PXL2, and/or a third pixel PXL3. Hereinafter, at least one of the first pixel PXL1, the second pixel PXL2, and the third pixel PXL3 may be referred to as a "pixel PXL," or two or more types of pixels may be collectively referred to as "pixels PXL."

The pixels PXL may be regularly arranged according to a stripe or PENTILE™ arrangement structure (e.g., a RGBG matrix structure, a PENTILE™ matrix structure, a PENTILE™ structure, or an RGBG structure, PENTILE™ being a registered trademark of Samsung Display Co., Ltd., Republic of Korea). However, the arrangement structure of the pixels PXL is not limited thereto, and the pixels PXL may be arranged in the display area DA in various structures and/or methods.

According to one or more embodiments, two or more types of pixels PXL for respectively emitting light of different colors may be located in the display area DA. For example, first pixels PXL1 emitting light of a first color, second pixels PXL2 emitting light of a second color, and third pixels PX3 emitting light of a third color may be arranged in the display area DA. At least one of the first to third pixels PXL1, PXL2, and PXL3 located adjacent to each other may constitute one pixel unit PXU capable of emitting light of various colors. For example, each of the first to third pixels PXL1, PXL2, and PXL3 may be a pixel for emitting light of a color (e.g., predetermined color). According to one or more embodiments, the first pixel PXL1 may be a red pixel for emitting red light, the second pixel PXL2 may be a green pixel for emitting green light, and the third pixel PXL3 may be a blue pixel for emitting blue light, but the present disclosure is not limited thereto.

In one or more embodiments, the first pixel PXL1, the second pixel PXL2, and the third pixel PXL3 include light emitting elements for emitting light of the same color as each other. However, by including respective color conversion layers and/or color filter layers of different colors located on each light emitting element, the first pixel PXL1, the second pixel PXL2, and the third pixel PXL3 may emit light of the first color, light of the second color, and light of the third color, respectively. In one or more other embodiments, the first pixel PXL1, the second pixel PXL2, and the third pixel PXL3 include a light emitting element of a first color, a light emitting element of a second color, and a light emitting element of a third color to emit light of the first color, light of the second color, and light of the third color, respectively. However, the color, type, and/or number of pixels PXL constituting each pixel unit PXU is not particularly limited. That is, the color of the light emitted by each pixel PXL may be variously changed.

The pixel PXL may include at least one light source driven by a control signal (e.g., predetermined control signal, such as a scan signal and a data signal) and/or a power (e.g., predetermined power, such as a first power and a second power). In one or more embodiments, the light source may include, for example, ultra-small pillar-shaped light emitting elements LD having a size as small as a nanometer scale to a micrometer scale as at least one light emitting element LD according to one of the embodiments of FIGS. 1 and 2. However, the present disclosure is not necessarily limited thereto, and various types of light emitting elements LD may be used as the light source of the pixel PXL.

In one or more embodiments, each pixel PXL may be configured as an active pixel. However, the types, structures, and/or driving methods of the pixels PXL applicable to the display device are not particularly limited. For example, each pixel PXL may be configured as a pixel of a passive or active type light emitting display device having various structures and/or driving methods.

Figure 4:
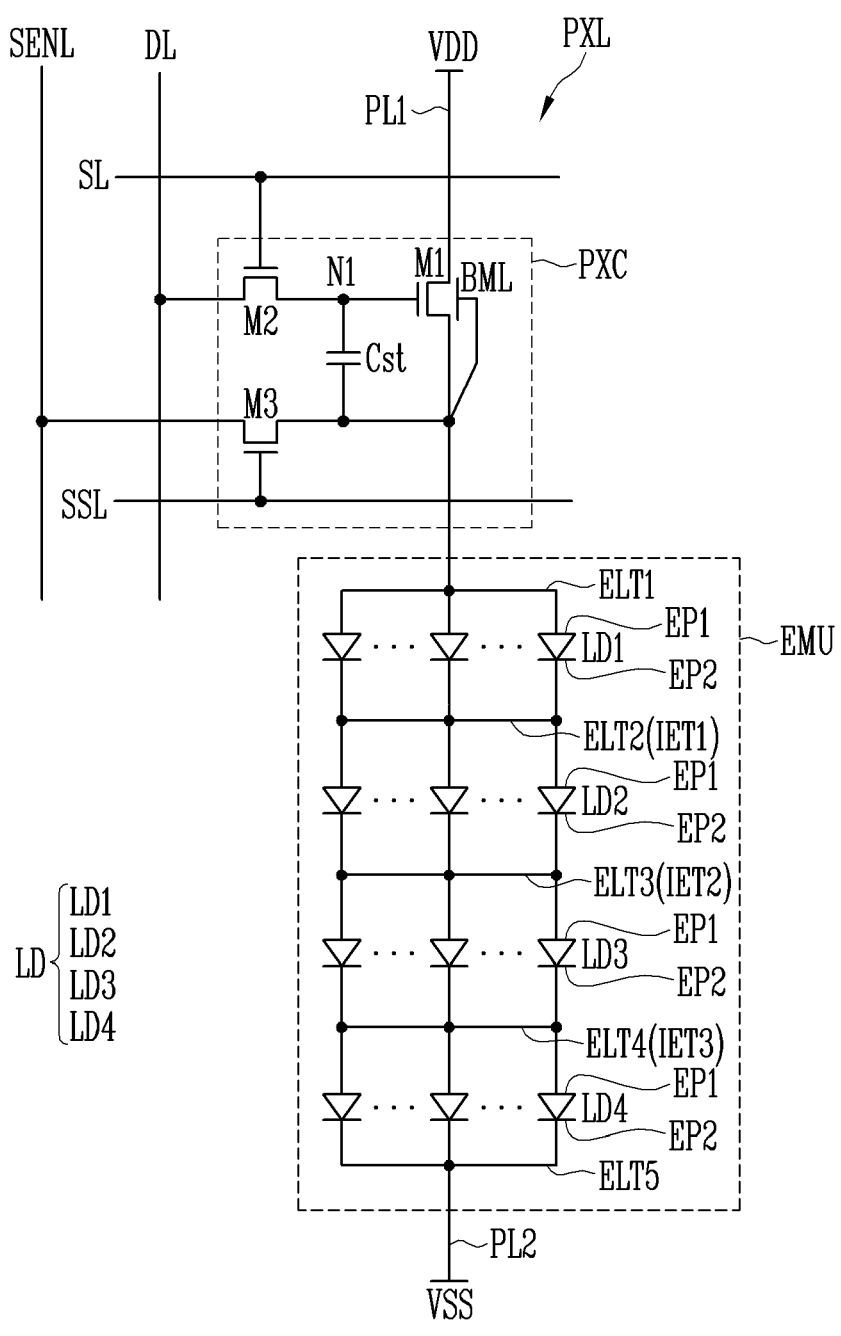
FIG. 4 is a circuit diagram illustrating a pixel according to one or more embodiments.

FIG. 4 is a circuit diagram illustrating a pixel according to one or more embodiments.

A pixel PXL illustrated in FIG. 4 may be one of the first pixel PXL1, the second pixel PXL2, and the third pixel PXL3 provided in the display panel PNL of FIG. 3. The first pixel PXL1, the second pixel PXL2, and the third pixel PXL3 may have substantially the identical or similar structure to each other.

Referring to FIG. 4, each pixel PXL may further include an emission unit EMU for generating light having a luminance corresponding to a data signal, and a pixel circuit PXC for driving the emission unit EMU.

The pixel circuit PXC may be connected between the first power VDD and the emission unit EMU. In addition, the pixel circuit PXC may be connected to a scan line SL and a data line DL of the corresponding pixel PXL, and may control the operation of the emission unit EMU in response to the scan signal and the data signal supplied from the scan line SL and the data line DL. In addition, the pixel circuit PXC may be further selectively connected to a sensing signal line SSL and a sensing line SENL.

The pixel circuit PXC may include at least one transistor and a capacitor. For example, the pixel circuit PXC may include a first transistor M1, a second transistor M2, a third transistor M3, and a storage capacitor Cst.

The first transistor M1 may be connected between the first power VDD and a first connection electrode ELT1. A gate electrode of the first transistor M1 may be connected to a first node N1. The first transistor M1 may control a driving current supplied to the emission unit EMU in response to a voltage of the first node N1. That is, the first transistor M1 may be a driving transistor for controlling the driving current of the pixel PXL.

In one or more embodiments, the first transistor M1 may optionally include a lower conductive layer BML (also referred to as a "lower electrode," a "back gate electrode," or a "lower light-blocking layer"). The gate electrode of the first transistor M1 and the lower conductive layer BML may overlap each other with an insulating layer located therebetween. In one or more embodiments, the lower conductive layer BML may be connected to one electrode of the first transistor M1, for example, a source electrode or a drain electrode.

When the first transistor M1 includes the lower conductive layer BML, a back-biasing technology (or a sync technology) may be applied when the pixel PXL is driven. That is, a back-biasing voltage is applied to the lower conductive layer BML of the first transistor M1 to shift a threshold voltage of the first transistor M1 in a negative or positive direction. For example, by connecting the lower conductive layer BML to the source electrode of the first transistor M1 and applying the source-sink technology, the threshold voltage of the first transistor M1 may be shifted in a negative or positive direction. In addition, when the lower conductive layer BML is located under the semiconductor pattern constituting the channel of the first transistor M1, the lower conductive layer BML may serve as a light-blocking pattern to stabilize operating characteristics of the first transistor M1. However, the function and/or utilization method of the lower conductive layer BML is not limited thereto.

The second transistor M2 may be connected between the data line DL and the first node N1. In addition, the gate electrode of the second transistor M2 may be connected to the scan line SL. The second transistor M2 may be turned on when a scan signal of a gate-on voltage (e.g., a high level voltage) is supplied from the scan line SL, and may connect the data line DL to the first node N1.

For each frame period, a data signal of the corresponding frame may be supplied to the data line DL, and the data signal may be transmitted to the first node N1 through the second transistor M2 that is turned on during a period in which the scan signal of the gate-on voltage is supplied. That is, the second transistor M2 may be a switching transistor for transmitting each data signal to the inside of the pixel PXL.

One electrode of the storage capacitor Cst may be connected to the first node N1, and the other electrode of the storage capacitor Cst may be connected to the second electrode of the first transistor M1. The storage capacitor Cst may be charged with a voltage corresponding to the data signal supplied to the first node N1 during each frame period.

The third transistor M3 may be connected between the first connection electrode ELT1 (or the second electrode of the first transistor M1) and the sensing line SENL. A gate electrode of the third transistor M3 may be connected to the sensing signal line SSL. The third transistor M3 may transmit a voltage value applied to the first connection electrode ELT1 to the sensing line SENL according to the sensing signal supplied to the sensing signal line SSL. The voltage value transmitted through the sensing line SENL may be provided to an external circuit (e.g., a timing controller), and the external circuit may extract characteristic information (e.g., the threshold voltage of the first transistor M1) of each pixel PXL based on the provided voltage value. The extracted characteristic information may be used to convert image data so that characteristic deviation between the pixels PXL is compensated.

On the other hand, although all of the transistors included in the pixel circuit PXC are illustrated as n-type transistors in FIG. 4, the present disclosure is not necessarily limited thereto. For example, at least one of the first, second, and third transistors M1, M2, and M3 may be changed to a p-type transistor.

In addition, the structure and driving method of the pixel PXL may be variously changed. For example, the pixel circuit PXC may include pixel circuits having various structures and/or driving methods in addition to the embodiment illustrated in FIG. 4.

For example, the pixel circuit PXC may omit the third transistor M3. In addition, the pixel circuit PXC may further include other circuit elements, such as a compensation transistor for compensating for the threshold voltage of the first transistor M1, an initialization transistor for initializing the voltage of the first node N1 and/or the first connection electrode ELT1, an emission control transistor for controlling a period in which the driving current is supplied to the emission unit EMU, and/or a boosting capacitor for boosting the voltage of the first node N1.

The emission unit EMU may include at least one light emitting element LD, for example, a plurality of light emitting elements LD, connected between the first power VDD and the second power VSS.

For example, the emission unit EMU may include a first connection electrode ELT1 connected to the first power VDD through the pixel circuit PXC and the first power line PL1, a fifth connection electrode ELT5 connected to the second power VSS through the second power line PL2, and a plurality of light emitting elements LD connected between the first and fifth connection electrodes ELT1 and ELT5.

The first power VDD and the second power VSS may have different potentials so that the light emitting elements LD emit light. For example, the first power VDD may be set as a high potential power, and the second power VSS may be set as a low potential power.

In one or more embodiments, the emission unit EMU may include at least one series stage. Each series stage may include a pair of electrodes (e.g., two electrodes) and at least one light emitting element LD connected in a forward direction between the pair of electrodes. The number of series stages constituting the emission unit EMU and the number of light emitting elements LD constituting each series stage are not particularly limited. For example, the number of light emitting elements LD constituting each series stage may be identical to or different from each other, and the number of light emitting elements LD is not particularly limited.

For example, the emission unit EMU may include a first series stage including at least one first light emitting element LD1, a second series stage including at least one second light emitting element LD2, a third series stage including at least one third light emitting element LD3, and a fourth series stage including at least one fourth light emitting element LD4.

The first series stage may include the first connection electrode ELT1, the second connection electrode ELT2, and at least one first light emitting element LD1 connected between the first and second connection electrodes ELT1 and ELT2. Each of the first light emitting elements LD1 may be connected in a forward direction between the first and second connection electrodes ELT1 and ELT2. For example, the first end portion EP1 of the first light emitting element LD1 may be connected to the first connection electrode ELT1, and the second end portion EP2 of the first light emitting element LD1 may be connected to the second connection electrode ELT2.

The second series stage may include the second connection electrode ELT2, the third connection electrode ELT3, and at least one second light emitting element LD2 connected between the second and third connection electrodes ELT2 and ELT3. Each of the second light emitting elements LD2 may be connected in a forward direction between the second and third connection electrodes ELT2 and ELT3. For example, the first end portion EP1 of the second light emitting element LD2 may be connected to the second connection electrode ELT2, and the second end portion EP2 of the second light emitting element LD2 may be connected to the third connection electrode ELT3.

The third series stage may include the third connection electrode ELT3, the fourth connection electrode ELT4, and at least one third light emitting element LD3 connected between the third and fourth connection electrodes ELT3 and ELT4. Each of the third light emitting elements LD3 may be connected in a forward direction between the third and fourth connection electrodes ELT3 and ELT4. For example, the first end portion EP1 of the third light emitting element LD3 may be connected to the third connection electrode ELT3, and the second end portion EP2 of the third light emitting element LD3 may be connected to the fourth connection electrode ELT4.

The fourth series stage may include the fourth connection electrode ELT4, the fifth connection electrode ELT5, and at least one fourth light emitting element LD4 connected between the fourth and fifth connection electrodes ELT4 and ELT5. Each of the fourth light emitting elements LD4 may be connected in a forward direction between the fourth and fifth connection electrodes ELT4 and ELT5. For example, the first end portion EP1 of the fourth light emitting element LD4 may be connected to the fourth connection electrode ELT4, and the second end portion EP2 of the fourth light emitting element LD4 may be connected to the fifth connection electrode ELT5.

The first electrode of the emission unit EMU, for example, the first connection electrode ELT1 may be an anode electrode of the emission unit EMU. The last electrode of the emission unit EMU, for example, the fifth connection electrode ELT5 may be a cathode electrode of the emission unit EMU.

The remaining electrodes of the emission unit EMU, for example, the second connection electrode ELT2, the third connection electrode ELT3, and/or the fourth connection electrode ELT4 may constitute middle electrodes. For example, the second connection electrode ELT2 may constitute a first middle electrode IET1, the third connection electrode ELT3 may constitute a second middle electrode IET2, and the fourth connection electrode ELT4 may constitute a third middle electrode IET3.

When the light emitting elements LD are connected in a series/parallel structure, power efficiency may be improved compared to a case where the same number of light emitting elements LD are connected only in parallel. In addition, in the pixel PXL in which the light emitting elements LD are connected in a series/parallel structure, even if a short defect occurs in some series terminals, a luminance (e.g., predetermined luminance) can be expressed through the light emitting elements LD of the remaining series stage, thereby reducing the possibility of defective dark spots in the pixel PXL. However, the present disclosure is not necessarily limited thereto, and the light emitting elements LD may be connected only in series to form the emission unit EMU, or may be connected only in parallel to form the emission unit EMU.

The light emitting elements LD may include a first end portion EP1 (e.g., a p-type end portion) connected to the first power VDD via at least one electrode (e.g., the first connection electrode ELT1), the pixel circuit PXC, and/or the first power line PL1, and may include a second end portion EP2 (e.g., an n-type end portion) connected to the second power VSS via at least one other electrode (e.g., the fifth connection electrode ELT5) and the second power line PL2. That is, the light emitting elements LD may be connected in a forward direction between the first power VDD and the second power VSS. The light emitting elements LD connected in a forward direction may constitute effective light supplies of the emission unit EMU.

When the driving current is supplied through the pixel circuit PXC, the light emitting elements LD may emit light with a luminance corresponding to the driving current. For example, during each frame period, the pixel circuit PXC may supply a driving current corresponding to a gray scale value to be expressed in the corresponding frame to the emission unit EMU. Therefore, while the light emitting elements LD emit light with a luminance corresponding to the driving current, the emission unit EMU may express the luminance corresponding to the driving current.

Figure 5:
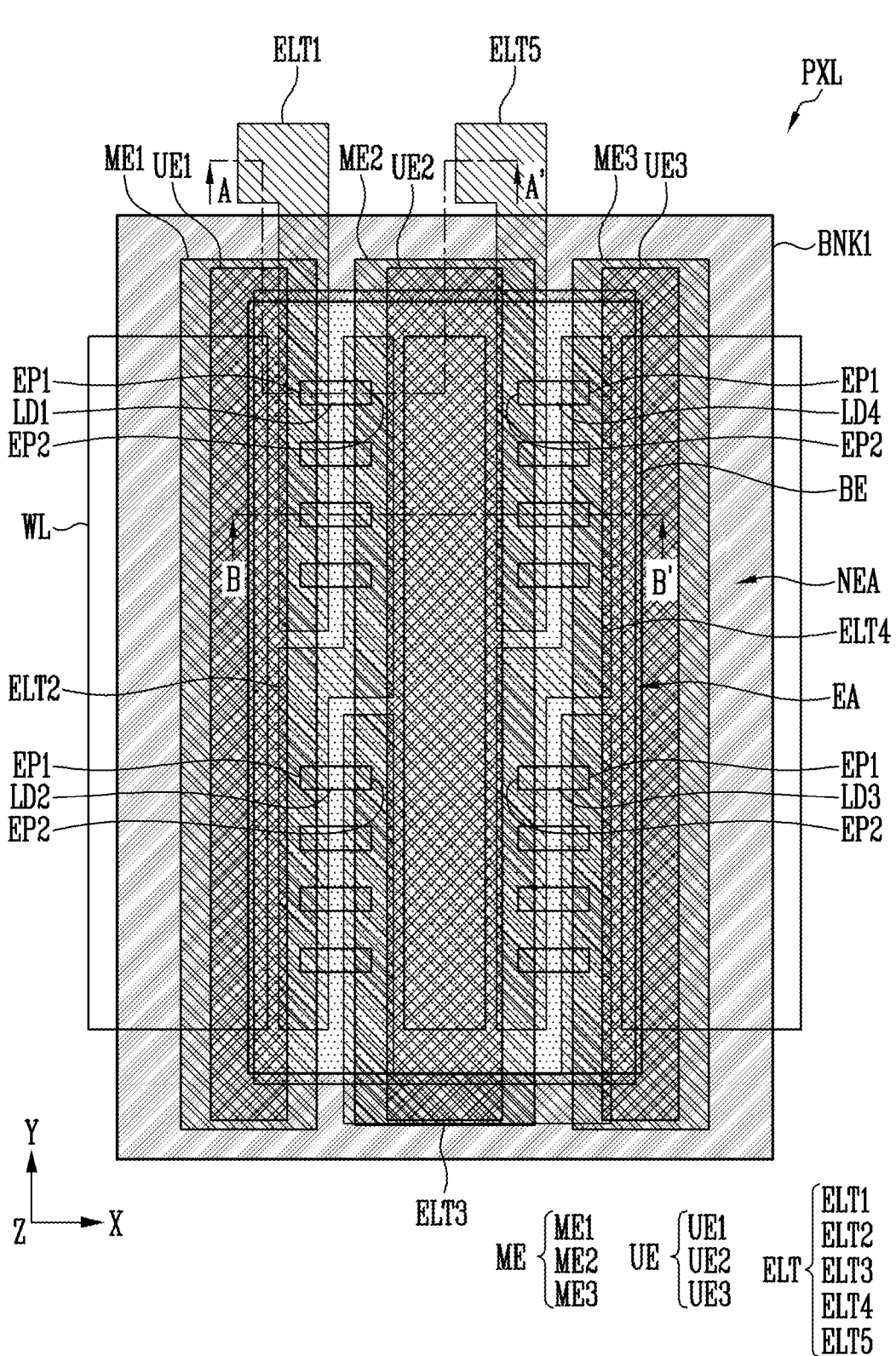
FIGS. 5 and 6 are plan views illustrating a pixel according to one or more embodiments.
Figure 6:
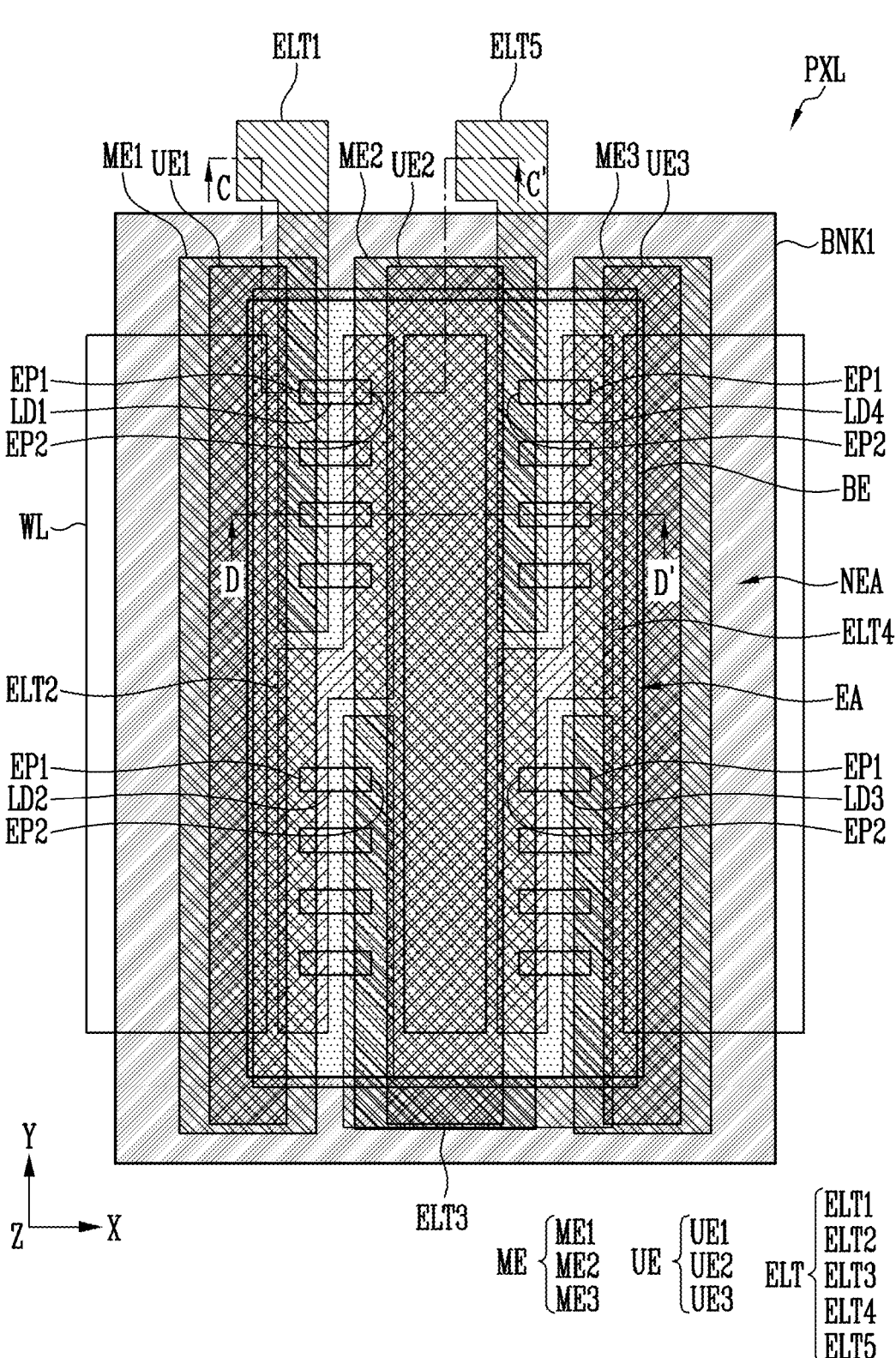
Figure 7:
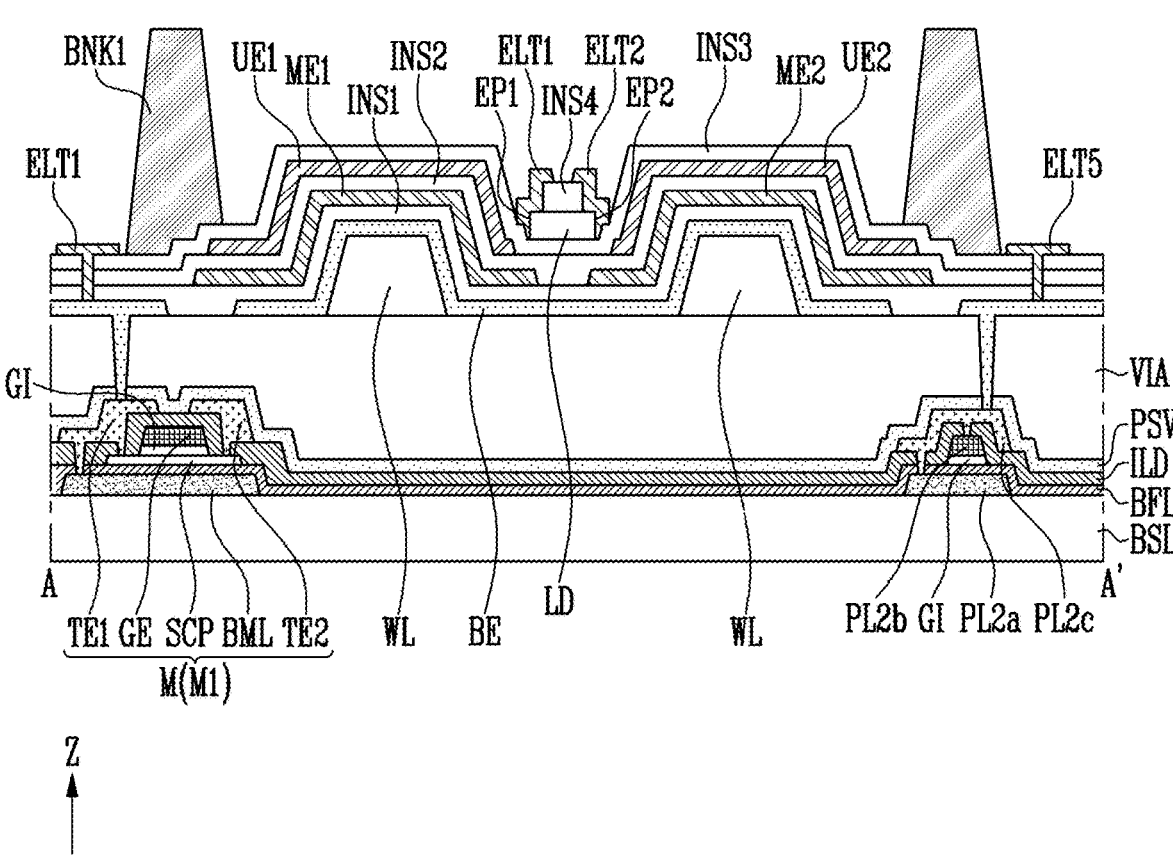
FIG. 7 is a cross-sectional view taken along the line A-A' of FIG. 5.
Figure 8:
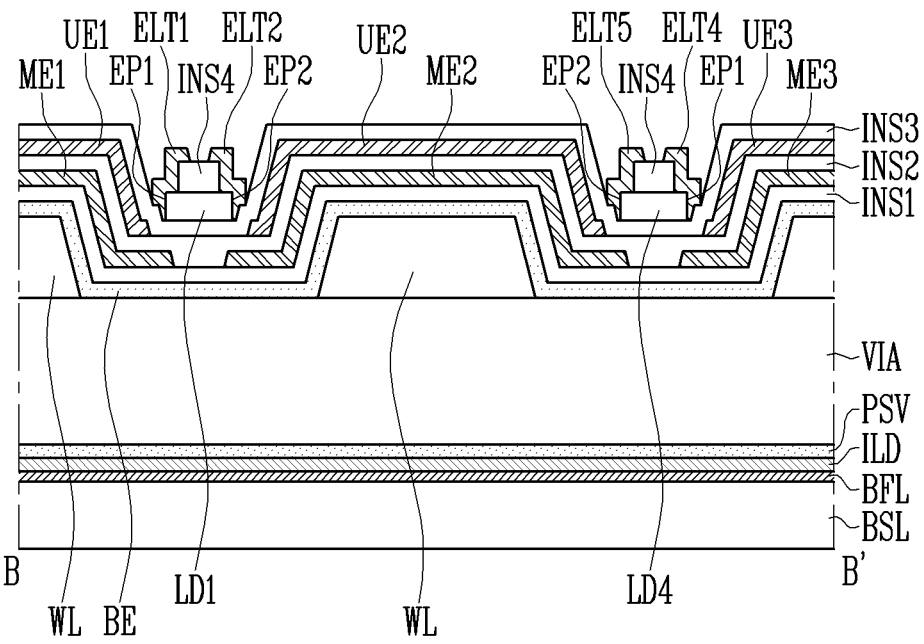
FIG. 8 is a cross-sectional view taken along the line B-B' of FIG. 5.
Figure 8:
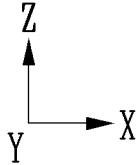
Figure 9:
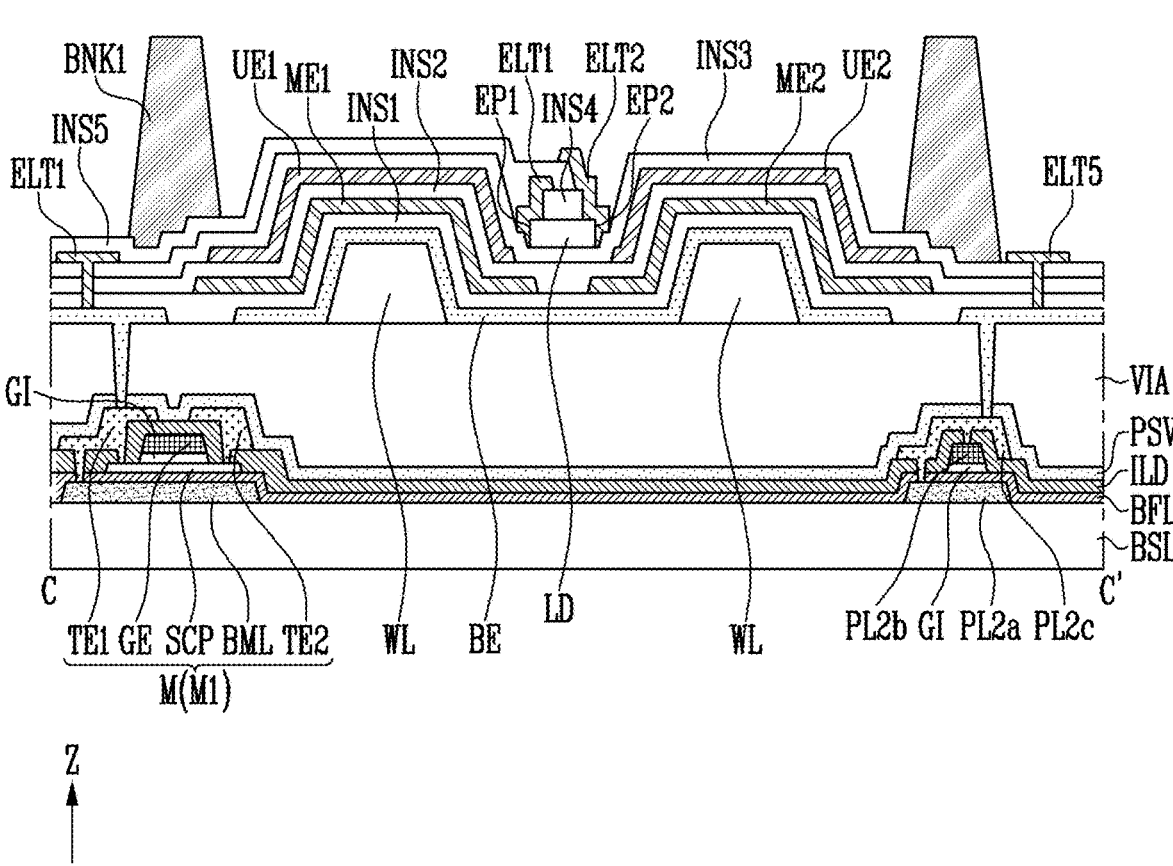
FIG. 9 is a cross-sectional view taken along the line C-C' of FIG. 6.
Figure 10:
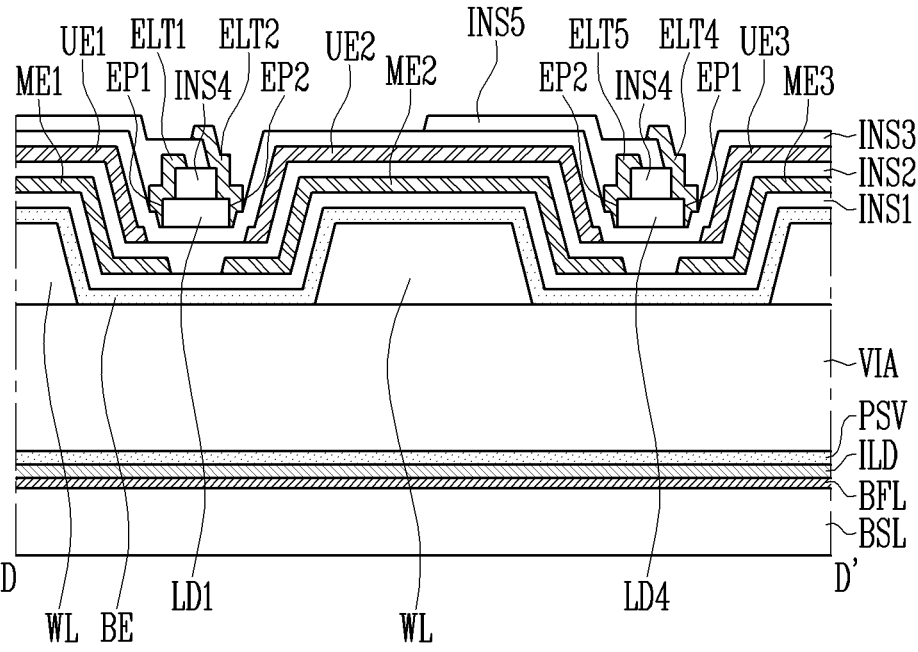
FIG. 10 is a cross-sectional view taken along the line D-D' of FIG. 6.
Figure 10:
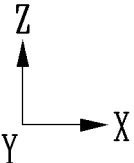
Figure 11:
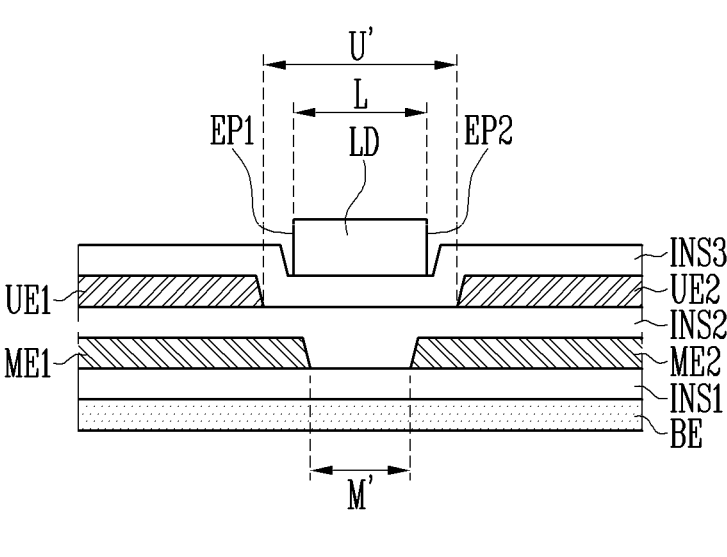
FIG. 11 is a cross-sectional view for describing a lower electrode, a middle electrode, and an upper electrode according to one or more embodiments.

FIGS. 5 and 6 are plan views illustrating a pixel according to one or more embodiments. FIG. 7 is a cross-sectional view taken along the line A-A' of FIG. 5. FIG. 8 is a cross-sectional view taken along the line B-B' of FIG. 5. FIG. 9 is a cross-sectional view taken along the line C-C' of FIG. 6. FIG. 10 is a cross-sectional view taken along the line D-D' of FIG. 6. FIG. 11 is a cross-sectional view for describing a lower electrode, a middle electrode, and an upper electrode according to one or more embodiments.

As an example, the pixels illustrated in FIGS. 5 and 6 may be one of the first to third pixels PXL1, PXL2, and PXL3 constituting the pixel unit PXU of FIG. 3, and the first to third pixels PXL1, PXL2, and PXL3 may have substantially the same or similar structure. Also, FIGS. 5 and 6 disclose one or more embodiments in which each pixel PXL includes light emitting elements LD located in four series stages as illustrated in FIG. 4, but the number of series stages of each pixel PXL may be variously changed according to one or more embodiments.

Hereinafter, one or more of the first to fourth light emitting elements LD1, LD2, LD3, and LD4 may be referred to as a "light emitting element LD," or two or more types of light emitting elements may be referred to as "light emitting elements LD." In addition, at least one of the middle electrodes including the first to third middle electrodes ME1, ME2, and ME3 may be referred to as a "middle electrode ME" or "middle electrodes ME," at least one of the upper electrodes including the first to third upper electrodes UE1, UE2, and UE3 is referred to as an "upper electrode UE" or "upper electrodes UE," and at least one of the electrodes including the first to fifth connection electrodes ELT1, ELT2, ELT3, ELT4, and ELT5 is referred to as a "connection electrode ELT" or "connection electrodes ELT."

Referring to FIGS. 5 and 6, each pixel PXL may include an emission area EA and a non-emission area NEA. The emission area EA may be an area capable of emitting light, including the light emitting elements LD. The non-emission area NEA may be located to surround the emission area EA. The non-emission area NEA may be an area in which a first bank BNK1 surrounding the emission area EA is provided. The first bank BNK1 may be provided in the non-emission area NEA to at least partially surround the emission area EA.

The first bank BNK1 may include/define an opening overlapping the emission area EA. The opening of the first bank BNK1 may provide a space in which the light emitting elements LD may be provided in an operation of supplying the light emitting elements LD to each pixel PXL. For example, a desired type and/or amount of light emitting element ink may be supplied to the areas partitioned by the opening of the first bank BNK1.

The first bank BNK1 may include an organic material, such as an acrylic resin, an epoxy resin, a phenolic resin, a polyamide resin, a polyimide resin, a polyester resin, a polyphenylenesulfide resin, or benzocyclobutene (BCB). However, the present disclosure is not necessarily limited thereto. The first bank BNK1 may include various types of inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

In some embodiments, the first bank BNK1 may include at least one light-blocking and/or reflective material. Therefore, light leakage between the adjacent pixels PXL may be reduced or prevented. For example, the first bank BNK1 may include a black pigment, but the present disclosure is not necessarily limited thereto.

The pixel PXL may include partition walls WL, a lower electrode BE, middle electrodes ME, upper electrodes UE, light emitting elements LD, and/or connection electrodes ELT.

The partition walls WL may be provided in at least the emission area EA. The partition walls WL may be at least partially located in the non-emission area NEA. The partition walls WL may extend in the second direction (Y-axis direction) and may be apart from each other in the first direction (X-axis direction).

Each of the partition walls WL may partially overlap at least one of the lower electrode BE, the middle electrode ME, and/or the upper electrode UE in at least the emission area EA. For example, the partition walls WL may be provided under the lower electrode BE, the middle electrode ME, and/or the upper electrode UE. As the partition wall WL is provided under an area of each of the lower electrode BE, the middle electrode ME, and/or the upper electrode UE, the area of each of the lower electrode BE, the middle electrode ME, and/or the upper electrode UE may protrude in the upper direction of the pixel PXL, that is, the third direction (Z-axis direction) in the area where the partition walls WL are formed. When the partition walls WL and/or the lower electrode BE, the middle electrode ME, and/or the upper electrode UE include a reflective material, a reflective wall structure may be formed around the light emitting elements LD. Therefore, light emitted from the light emitting elements LD may be emitted in the upper direction of the pixel PXL (e.g., the front direction of the display panel PNL including a viewing angle range (e.g., predetermined viewing angle range)), thereby improving light output efficiency of the display panel PNL.

The lower electrode BE, the middle electrodes ME, and/or the upper electrodes UE may be provided in at least the emission area EA. The lower electrode BE, the middle electrodes ME, and/or the upper electrodes UE may at least partially overlap each other. The lower electrode BE, the middle electrodes ME, and/or the upper electrodes UE may extend in the second direction (Y-axis direction). The middle electrodes ME and/or the upper electrodes UE may be spaced apart from each other in the first direction (X-axis direction).

The first to third middle electrodes ME1, ME2, and ME3 may extend in the second direction (Y-axis direction) and may be sequentially located while being spaced apart from each other in the first direction (X-axis direction). The first to third upper electrodes UE1, UE2, and UE3 may extend in the second direction (Y-axis direction) and may be sequentially located while being spaced apart from each other in the first direction (X-axis direction). The first upper electrode UE1 may overlap the first middle electrode ME1, the second upper electrode UE2 may overlap the second middle electrode ME2, and the third upper electrode UE3 may overlap the third middle electrode ME3.

The lower electrode BE, the middle electrodes ME, and/or the upper electrodes UE may receive different signals during the process of aligning the light emitting elements LD. In one or more embodiments, the lower electrode BE may receive a first alignment signal, the first to third middle electrodes ME1, ME2, and ME3 may receive a second alignment signal, and the first to third upper electrodes UE1, UE2, and UE3 may receive the first alignment signal.

In one or more other embodiments, the lower electrode BE may receive the first alignment signal, the first middle electrode ME1 and/or the third middle electrode ME3 may receive the second alignment signal, and the second middle electrode ME2 may receive the first alignment signal. In this case, the first upper electrode UE1 and/or the third upper electrode UE3 may receive the first alignment signal, and the second upper electrode UE2 may receive the second alignment signal.

In one or more other embodiments, the lower electrode BE may receive the first alignment signal, the first middle electrode ME1 and/or the third middle electrode ME3 may receive the first alignment signal, and the second middle electrode ME2 may receive the second alignment signal. In this case, the first upper electrode UE1 and/or the third upper electrode UE3 may receive the second alignment signal, and the second upper electrode UE2 may receive the first alignment signal. For example, the first alignment signal may be an AC voltage and the second alignment signal may be an AC voltage, but the present disclosure is not necessarily limited thereto.

As described above, when the lower electrode BE, the middle electrode ME, and/or the upper electrode UE receive different alignment signals, a horizontal electric field as well as a vertical electric field may be formed between the lower electrode BE, the middle electrode ME, and/or the upper electrode UE, thereby improving alignment efficiency of the light emitting elements LD. However, the alignment signals supplied to the lower electrode BE, the middle electrode ME, and/or the upper electrode UE are not necessarily limited to the above-described range, and may be variously changed in a range for forming the vertical and horizontal electric fields.

Each of the light emitting elements LD may be aligned between a pair of middle electrodes ME and/or between a pair of upper electrodes UE in the emission area EA. Also, the light emitting elements LD may be electrically connected between the pair of connection electrodes ELT.

The first light emitting element LD1 may be aligned between the first and second middle electrodes ME1 and ME2 (or between the first and second upper electrodes UE1 and UE2). The first light emitting element LD1 may be electrically connected between the first and second connection electrodes ELT1 and ELT2. For example, the first light emitting element LD1 may be aligned in a first area (e.g., an upper area) of the first and second middle electrodes ME1 and ME2 (or a first area (e.g., an upper area) of the first and second upper electrodes UE1 and UE2), the first end portion EP1 of the first light emitting element LD1 may be electrically connected to the first connection electrode ELT1, and the second end portion EP2 of the first light emitting element LD1 may be electrically connected to the second connection electrode ELT2.

The second light emitting element LD2 may be aligned between the first and second middle electrodes ME1 and ME2 (or between the first and second upper electrodes UE1 and UE2). The second light emitting element LD2 may be electrically connected between the first and second connection electrodes ELT2 and ELT3. For example, the second light emitting element LD2 may be aligned in a second area (e.g., a lower area) of the first and second middle electrodes ME1 and ME2 (or a second area (e.g., a lower area) of the first and second upper electrodes UE1 and UE2), the first end portion EP1 of the second light emitting element LD2 may be electrically connected to the second connection electrode ELT2, and the second end portion EP2 of the second light emitting element LD2 may be electrically connected to the third connection electrode ELT3.

The third light emitting element LD3 may be aligned between the second and third middle electrodes ME2 and ME3 (or between the second and third upper electrodes UE2 and UE3). The third light emitting element LD3 may be electrically connected between the third and fourth connection electrodes ELT3 and ELT4. For example, the third light emitting element LD3 may be aligned in a second area (e.g., a lower area) of the second and third middle electrodes ME2 and ME3 (or a second area (e.g., a lower area) of the second and third upper electrodes UE2 and UE3), the first end portion EP1 of the third light emitting element LD3 may be electrically connected to the third connection electrode ELT3, and the second end portion EP2 of the third light emitting element LD3 may be electrically connected to the fourth connection electrode ELT4.

The fourth light emitting element LD4 may be aligned between the second and third middle electrodes ME2 and ME3 (or between the second and third upper electrodes UE2 and UE3). The fourth light emitting element LD4 may be electrically connected between the fourth and fifth connection electrodes ELT4 and ELT5. For example, the fourth light emitting element LD4 may be aligned in a first area (e.g., an upper area) of the second and third middle electrodes ME2 and ME3 (or a first area (e.g., an upper area) of the second and third upper electrodes UE2 and UE3), the first end portion EP1 of the fourth light emitting element LD4 may be electrically connected to the fourth connection electrode ELT4, and the second end portion EP2 of the fourth light emitting element LD4 may be electrically connected to the fifth connection electrode ELT5.

For example, the first light emitting element LD1 may be positioned in the upper left area of the emission area EA, and the second light emitting element LD2 may be positioned in the lower left area of the emission area EA. The third light emitting element LD3 may be positioned in the lower right area of the emission area EA, and the fourth light emitting element LD4 may be positioned in the upper right area of the emission area EA. However, the arrangement and/or connection structure of the light emitting elements LD may be variously changed according to the structure of the emission unit EMU and/or the number of series stages.

Each of the connection electrodes ELT may be provided in at least the emission area EA, and may be located to overlap with at least one of the lower electrode BE, the middle electrode ME, the upper electrode UE, and/or the light emitting element LD. For example, the connection electrodes ELT may be formed on the light emitting elements LD to overlap the light emitting elements LD, and may be electrically connected to the light emitting elements LD.

The first connection electrode ELT1 may be located on the first end portions EP1 of the first light emitting elements LD1, and may be electrically connected to the first end portions EP1 of the first light emitting elements LD1.

The second connection electrode ELT2 may be located on the second end portions EP2 of the first light emitting elements LD1, and may be electrically connected to the second end portions EP2 of the first light emitting elements LD1. In addition, the second connection electrode ELT2 may be located on the first end portions EP1 of the second light emitting elements LD2, and may be electrically connected to the first end portions EP1 of the second light emitting elements LD2. For example, the second connection electrode ELT2 may be electrically connected to the second end portions EP2 of the first light emitting elements LD1 and the first end portions EP1 of the second light emitting elements LD2 in the emission area EA. To this end, the second connection electrode ELT2 may have a curved shape. For example, the second connection electrode ELT2 may have a bent or curved structure at the boundary between the area where at least one first light emitting element LD1 is arranged and the area where at least one second light emitting element LD2 is arranged.

The third connection electrode ELT3 may be located on the second end portions EP2 of the second light emitting elements LD2, and may be electrically connected to the second end portions EP2 of the second light emitting elements LD2. In addition, the third connection electrode ELT3 may be located on the first end portions EP1 of the third light emitting elements LD3, and may be electrically connected to the first end portions EP1 of the third light emitting elements LD3. For example, the third connection electrode ELT3 may be electrically connected to the second end portions EP2 of the second light emitting elements LD2 and the first end portions EP1 of the third light emitting elements LD3 in the emission area EA. To this end, the third connection electrode ELT3 may have a curved shape. For example, the third connection electrode ELT3 may have a bent or curved structure at the boundary between the area where at least one second light emitting element LD2 is arranged and the area where at least one third light emitting element LD3 is arranged.

The fourth connection electrode ELT4 may be located on the second end portions EP2 of the third light emitting elements LD3, and may be electrically connected to the second end portions EP2 of the third light emitting elements LD3. In addition, the fourth connection electrode ELT4 may be located on the first end portions EP1 of the fourth light emitting elements LD4, and may be electrically connected to the first end portions EP1 of the fourth light emitting elements LD4. For example, the fourth connection electrode ELT4 may be electrically connected to the second end portions EP2 of the third light emitting elements LD3 and the first end portions EP1 of the fourth light emitting elements LD4 in the emission area EA. To this end, the fourth connection electrode ELT4 may have a curved shape. For example, the fourth connection electrode ELT4 may have a bent or curved structure at the boundary between the area where at least one third light emitting element LD3 is arranged and the area where at least one fourth light emitting element LD4 is arranged.

The fifth connection electrode ELT5 may be located on the second end portions EP2 of the fourth light emitting elements LD4, and may be electrically connected to the second end portions EP2 of the fourth light emitting elements LD4.

The first connection electrode ELT1, the third connection electrode ELT3, and/or the fifth connection electrode ELT5 may include the same conductive layer. In addition, the second connection electrode ELT2 and the fourth connection electrode ELT4 may include the same conductive layer. In one or more embodiments, as illustrated in FIG. 5, the first to fifth connection electrodes ELT1, ELT2, ELT3, ELT4, and ELT5 may include the same conductive layer. In this case, the first to fifth connection electrodes ELT1, ELT2, ELT3, ELT4, and ELT5 may be concurrently or substantially simultaneously formed in the same process. As such, when the connection electrodes ELT are concurrently or substantially simultaneously formed, the number of masks may be reduced and the manufacturing process may be simplified.

In one or more other embodiments, as illustrated in FIG. 6, the connection electrodes ELT may include a plurality of conductive layers. The first connection electrode ELT1, the third connection electrode ELT3, and/or the fifth connection electrode ELT5 may include one conductive layer, and the second connection electrode ELT2 and the fourth connection electrode ELT4 may include different conductive layers located on the first connection electrode ELT1, the third connection electrode ELT3, and/or the fifth connection electrode ELT5.

In the above-described manner, the light emitting elements LD aligned between the middle electrodes ME (or the upper electrodes UE) may be connected in a desired shape by using the connection electrodes ELT. For example, the first light emitting elements LD1, the second light emitting elements LD2, the third light emitting elements LD3, and the fourth light emitting elements LD4 may be sequentially connected in series by using the connection electrodes ELT.

Hereinafter, the cross-sectional structure of the pixel PXL will be described in detail with reference to FIGS. 7 to 11. FIGS. 7 and 9 illustrate the first transistor M1 among various circuit elements constituting the pixel circuit (PXC in FIG. 4). When there is no need to separately describe the first to third transistors M1, M2, and M3, they will be collectively referred to as "transistor M." On the other hand, the structure and/or the layer position of the transistors M are not limited to the embodiments illustrated in FIGS. 7 and 9, and may be variously changed according to one or more embodiments.

The pixels PXL according to one or more embodiments may include circuit elements including transistors M located on the base layer BSL and various wirings connected thereto. Elements constituting the above-described emission unit EMU may be located on the circuit elements.

The base layer BSL constitutes the base member and may be a rigid or flexible substrate or film. For example, the base layer BSL may be a rigid substrate including glass or tempered glass, a flexible substrate (or thin film) including plastic or metal, or at least one insulating layer. The material and/or physical properties of the base layer BSL are not particularly limited. In one or more embodiments, the base layer BSL may be substantially transparent. Here, the term "substantially transparent" may mean that light can be transmitted with a transmittance (e.g., predetermined transmittance) or higher. In one or more other embodiments, the base layer BSL may be translucent or opaque. In addition, the base layer BSL may include a reflective material according to one or more embodiments.

A lower conductive layer BML and a first power conductive layer PL2*a* may be located on the base layer BSL. The lower conductive layer BML and the first power conductive layer PL2*a* may be located on the same layer. For example, the lower conductive layer BML and the first power conductive layer PL2*a* may be concurrently or substantially simultaneously formed in the same process, but the present disclosure is not necessarily limited thereto. The first power conductive layer PL2*a* may constitute the second power line PL2 described with reference to FIG. 4 or the like.

The lower conductive layer BML and the first power conductive layer PL2*a* may include a single layer or multiple layers including molybdenum (Mo), copper (Cu), aluminum (Al), chromium (Cr), gold (Au), titanium (Ti), nickel (Ni), neodymium (Nd), indium (In), tin (Sn), and oxides or alloys thereof.

A buffer layer BFL may be located on the lower conductive layer BML and the first power conductive layer PL2*a*. The buffer layer BFL may reduce or prevent impurities diffusing into the circuit element. The buffer layer BFL may be a single layer, but may also include at least a double layer or more. When the buffer layer BFL is formed as multiple layers, each layer may include the same material or may include different materials.

A semiconductor pattern SCP may be located on the buffer layer BFL. For example, the semiconductor pattern SCP may include a first region in contact with the first transistor electrode TE1, a second region in contact with the second transistor electrode TE2, and a channel region between the first and second regions. According to one or more embodiments, one of the first and second regions may be a source region and the other thereof may be a drain region.

In some embodiments, the semiconductor pattern SCP may include polysilicon, amorphous silicon, oxide semiconductor, or the like. In addition, the channel region of the semiconductor pattern SCP may be an intrinsic semiconductor as a semiconductor pattern not doped with impurities, and each of the first and second regions of the semiconductor pattern SCP may be a semiconductor doped with an impurity (e.g., predetermined impurity).

A gate insulating layer GI may be located on the buffer layer BFL and the semiconductor pattern SCP. For example, the gate insulating layer GI may be located between the semiconductor pattern SCP and the gate electrode GE. In addition, the gate insulating layer GI may be located between the buffer layer BFL and the second power conductive layer PL2*b*. The gate insulating layer GI may include a single layer or multiple layers, and may include various types of inorganic materials, including silicon oxide (SiO$_x$), silicon nitride (SiN$_x$), silicon oxynitride (SiO$_x$N$_y$), aluminum nitride (AlN$_x$), aluminum oxide (AlO$_x$), zirconium oxide (ZrO$_x$), hafnium oxide (HfO$_x$), or titanium oxide (TiO$_x$).

The gate electrode GE of the transistor M and the second power conductive layer PL2*b* may be located on the gate insulating layer GI. The gate electrode GE and the second power conductive layer PL2*b* may be located on the same layer. For example, the gate electrode GE and the second power conductive layer PL2*b* may be concurrently or substantially simultaneously formed in the same process, but the present disclosure is not limited thereto. The gate electrode GE may be located to overlap the semiconductor pattern SCP in the third direction (Z-axis direction) on the gate insulating layer GI. The second power conductive layer PL2*b* may be located to overlap the first power conductive layer PL2*a* in the third direction (Z-axis direction) on the gate insulating layer GI. The second power conductive layer PL2*b* may constitute the second power line PL2 described with reference to FIG. 4 or the like together with the first power conductive layer PL2*a*.

The gate electrode GE and the second power conductive layer PL2*b* may each include a single layer or multiple layers including molybdenum (Mo), copper (Cu), aluminum (Al), chromium (Cr), gold (Au), titanium (Ti), nickel (Ni), neodymium (Nd), indium (In), tin (Sn), and oxides or alloys thereof. For example, the gate electrode GE and the second power conductive layer PL2*b* may each include multiple layers in which titanium (Ti), copper (Cu), and/or indium tin oxide (ITO) are sequentially or repeatedly stacked.

An interlayer insulating layer ILD may be located on the gate electrode GE and the second power conductive layer PL2*b*. For example, the interlayer insulating layer ILD may be located between the gate electrode GE and the first and second transistor electrodes TE1 and TE2. In addition, the interlayer insulating layer ILD may be located between the second power conductive layer PL2*b* and the third power conductive layer PL2*c*.

The interlayer insulating layer ILD may include a single layer or multiple layers, and may include various types of inorganic materials, including silicon oxide (SiO$_x$), silicon nitride (SiN$_x$), silicon oxynitride (SiO$_x$N$_y$), aluminum nitride (AlN$_x$), aluminum oxide (AlO$_x$), zirconium oxide (ZrO$_x$), hafnium oxide (HfO$_x$), or titanium oxide (TiO$_x$).

The first and second transistor electrodes TE1 and TE2 of the transistor M and the third power conductive layer PL2*c* may be located on the interlayer insulating layer ILD. The first and second transistor electrodes TE1 and TE2 and the third power conductive layer PL2*c* may be located on the same layer. For example, the first and second transistor electrodes TE1 and TE2 and the third power conductive layer PL2*c* may be concurrently or substantially simultaneously formed in the same process, but the present disclosure is not necessarily limited thereto.

The first and second transistor electrodes TE1 and TE2 may be located to overlap the semiconductor pattern SCP in the third direction (Z-axis direction). The first and second transistor electrodes TE1 and TE2 may be electrically connected to the semiconductor pattern SCP. For example, the first transistor electrode TE1 may be electrically connected to the first region of the semiconductor pattern SCP through a contact hole passing through the interlayer insulating layer ILD. In addition, the first transistor electrode TE1 may be electrically connected to the lower conductive layer BML through a contact hole passing through the interlayer insulating layer ILD and the buffer layer BFL. The second transistor electrode TE2 may be electrically connected to the second region of the semiconductor pattern SCP through a contact hole passing through the interlayer insulating layer ILD. According to one or more embodiments, one of the first and second transistor electrodes TE1 and TE2 may be a source electrode, and the other thereof may be a drain electrode.

The third power conductive layer PL2c may be located to overlap the first power conductive layer PL2a and/or the second power conductive layer PL2b in the third direction (Z-axis direction). The third power conductive layer PL2c may be electrically connected to the first power conductive layer PL2a and/or the second power conductive layer PL2b. For example, the third power conductive layer PL2c may be electrically connected to the first power conductive layer PL2a through a contact hole passing through the interlayer insulating layer ILD and the buffer layer BFL. In addition, the third power conductive layer PL2c may be electrically connected to the second power conductive layer PL2b through a contact hole passing through the interlayer insulating layer ILD. The third power conductive layer PL2c may constitute the second power line PL2 described with reference to FIG. 4 or the like together with the first power conductive layer PL2a and/or the second power conductive layer PL2b.

The first and second transistor electrodes TE1 and TE2 and the third power conductive layer PL2c may include a single layer or multiple layers including molybdenum (Mo), copper (Cu), aluminum (Al), chromium (Cr), gold (Au), titanium (Ti), nickel (Ni), neodymium (Nd), indium (In), tin (Sn), and oxides or alloys thereof.

A passivation layer PSV may be located on the first and second transistor electrodes TE1 and TE2 and the third power conductive layer PL2c. The passivation layer PSV may include a single layer or multiple layers, and may include various types of inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

A via layer VIA may be located on the passivation layer PSV. The via layer VIA may include an organic material so as to planarize the lower step. For example, the via layer VIA may include an organic material, such as an acrylic resin, an epoxy resin, a phenolic resin, a polyamide resin, a polyimide resin, a polyester resin, a polyphenylenesulfide resin, or benzocyclobutene (BCB). However, the present disclosure is not necessarily limited thereto. The via layer VIA may include various types of inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

Partition walls WL may be located on the via layer VIA. The partition walls WL may serve to form a height difference (e.g., predetermined height difference) so that the light emitting elements LD can be easily aligned in the emission area EA.

The partition walls WL may have various shapes according to embodiments. In one or more embodiments, the partition walls WL may have a shape protruding from the base layer BSL in the third direction (Z-axis direction). In addition, the partition walls WL may be formed to have an inclined surface inclined at an angle (e.g., predetermined angle) with respect to the base layer BSL. However, the present disclosure is not necessarily limited thereto, and the partition walls WL may have sidewalls having a curved surface or a stepped shape. For example, the partition walls WL may have a cross-section having a semi-circular or semi-elliptical shape.

The partition walls WL may include at least one organic material and/or at least one inorganic material. For example, the partition walls WL may include an organic material, such as an acrylic resin, an epoxy resin, a phenolic resin, a polyamide resin, a polyimide resin, a polyester resin, a polyphenylenesulfide resin, or benzocyclobutene (BCB). However, the present disclosure is not necessarily limited thereto. The partition walls WL may include various types of inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

A lower electrode BE may be located on the via layer VIA and the partition walls WL. The lower electrode BE may at least partially cover side surfaces and/or upper surfaces of the partition walls WL. The lower electrode BE located on the partition walls WL may have a shape corresponding to the partition wall WL. For example, the lower electrode BE located on the partition walls WL may include an inclined surface or a curved surface having a shape corresponding to the shape of the partition walls WL. In this case, the partition walls WL and the lower electrode BE are a reflective member that reflects the light emitted from the light emitting elements LD and guides the light in the front direction of the pixel PXL, that is, the third direction (Z-axis direction), thereby improving light output efficiency of the display panel PNL.

The lower electrode BE may include at least one conductive material. For example, the lower electrode BE may include at least one conductive material selected from at least one of various metal materials, such as silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and alloys including the same, a conductive oxide, such as indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and a conductive polymer, such as PEDOT, but the present disclosure is not necessarily limited thereto.

A first insulating layer INS1 may be located on the lower electrode BE. The first insulating layer INS1 may include a single layer or multiple layers, and may include various types of inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

Middle electrodes ME may be located on the first insulating layer INS1. The middle electrodes ME may be located on the lower electrode BE to at least partially overlap the lower electrode BE. The middle electrodes ME may be located on the partition walls WL and have a shape corresponding to the partition wall WL. For example, the middle electrodes ME may include an inclined surface or a curved surface having a shape corresponding to the shape of the partition walls WL. In this case, the partition walls WL and the middle electrodes ME are a reflective member that reflects the light emitted from the light emitting elements LD and guides the light in the front direction of the pixel PXL, that is, the third direction (Z-axis direction), thereby improving light output efficiency of the display panel PNL.

The middle electrodes ME may be spaced apart from each other. An interval M' between the middle electrodes ME in the first direction (X-axis direction) may be less than a length L of the light emitting elements LD in the first direction (X-axis direction), as shown in FIG. 11.

The middle electrodes ME may be located on the same layer. For example, the middle electrodes ME may be concurrently or substantially simultaneously formed in the same process, but the present disclosure is not necessarily limited thereto.

The middle electrodes ME may include at least one conductive material.

For example, the middle electrodes ME may include at least one conductive material selected from at least one of various metal materials, such as silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and alloys including the same, a conductive oxide, such as indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and a conductive polymer, such as PEDOT, but the present disclosure is not necessarily limited thereto.

A second insulating layer INS2 may be located on the middle electrodes ME. The second insulating layer INS2 may include a single layer or multiple layers, and may include various types of inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

Upper electrodes UE may be located on the second insulating layer INS2. The upper electrodes UE may be located on the middle electrodes ME to at least partially overlap the middle electrodes ME. The upper electrodes UE may be located on the partition walls WL and have a shape corresponding to the partition wall WL. For example, the upper electrodes UE may include an inclined surface or a curved surface having a shape corresponding to the shape of the partition walls WL. In this case, the partition walls WL and the upper electrodes UE are a reflective member that reflects the light emitted from the light emitting elements LD and guides the light in the front direction of the pixel PXL, that is, the third direction (Z-axis direction), thereby improving light output efficiency of the display panel PNL.

The upper electrodes UE may be spaced apart from each other. An interval U' between the upper electrodes UE in the first direction (X-axis direction) may be greater than a length L of the light emitting elements LD in the first direction (X-axis direction), as shown in FIG. 11.

The upper electrodes UE may be located on the same layer. For example, the upper electrodes UE may be concurrently or substantially simultaneously formed in the same process, but the present disclosure is not necessarily limited thereto.

The upper electrodes UE may include at least one conductive material. For example, the upper electrodes UE may include at least one conductive material selected from at least one of various metal materials, such as silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and alloys including the same, a conductive oxide, such as indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and a conductive polymer, such as PEDOT, but the present disclosure is not necessarily limited thereto.

A third insulating layer INS3 may be located on the upper electrodes UE. The third insulating layer INS3 may include a single layer or multiple layers, and may include various types of inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

A first bank BNK1 may be located on the third insulating layer INS3. The first bank BNK1 may include/define an opening overlapping the emission area EA. The opening of the first bank BNK1 may provide a space in which the light emitting elements LD may be provided in an operation of supplying the light emitting elements LD to each pixel PXL. For example, a desired type and/or amount of light emitting element ink may be supplied to the areas partitioned by the opening of the first bank BNK1.

The first bank BNK1 may include an organic material, such as an acrylic resin, an epoxy resin, a phenolic resin, a polyamide resin, a polyimide resin, a polyester resin. a polyphenylenesulfide resin, or benzocyclobutene (BCB). However, the present disclosure is not necessarily limited thereto. The first bank BNK1 may include various types of inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The light emitting elements LD may be located on the third insulating layer INS3. The light emitting elements LD may be provided in the opening of the first bank BNK1 and located between the partition walls WL. The light emitting elements LD may overlap the lower electrode BE and may be located between the middle electrodes ME (or between the upper electrodes UE).

The light emitting elements LD may be prepared in a dispersed form in the light emitting element ink, and may be supplied to each of the pixels PXL through an inkjet printing method or the like. For example, the light emitting elements LD may be dispersed in a volatile solvent and provided to each of the pixels PXL. Thereafter, as described above, when the alignment signal is supplied to the lower electrode BE, the middle electrodes ME, and/or the upper electrodes UE, the vertical and horizontal electric fields are formed between the lower electrode BE, the middle electrodes ME, and/or the upper electrodes UE. Therefore, the light emitting elements LD may be arranged between the middle electrodes ME (or between the upper electrodes UE). After the light emitting elements LD are aligned, the light emitting elements LD may be stably arranged by evaporating the solvent or removing the solvent in other ways.

A fourth insulating layer INS4 may be located on the light emitting elements LD. For example, the fourth insulating layer INS4 may be partially provided on the light emitting elements LD, and may expose the first and second end portions EP1 and EP2 of the light emitting elements LD. When the fourth insulating layer INS4 is formed on the light emitting elements LD after the alignment of the light emitting elements LD is completed, it is possible to reduce or prevent the likelihood of the light emitting elements LD being separated from the aligned positions.

The fourth insulating layer INS4 may include an organic material, such as an acrylic resin, an epoxy resin, a phenolic resin, a polyamide resin, a polyimide resin, a polyester resin, a polyphenylenesulfide resin, or benzocyclobutene (BCB). However, the present disclosure is not necessarily limited thereto. The fourth insulating layer INS4 may include various types of inorganic materials, including silicon oxide $(SiO_x)$, silicon nitride $(SiN_x)$, silicon oxynitride $(SiO_xN_y)$, aluminum nitride $(AlN_x)$, aluminum oxide $(AlO_x)$, zirconium oxide $(ZrO_x)$, hafnium oxide $(HfO_x)$, or titanium oxide $(TiO_x)$.

The connection electrodes ELT may be respectively located on the first and second end portions EP1 and EP2 of the light emitting elements LD exposed by the fourth insulating layer INS4.

The first connection electrode ELT1 may be directly located on the first end portions EP1 of the first light emitting elements LD1 to come into contact with the first end portion EP1 of the first light emitting elements LD1.

In addition, the second connection electrode ELT2 may be directly located on the second end portions EP2 of the first light emitting elements LD1 to come into contact with the second end portions EP2 of the first light emitting elements LD1. In addition, the second connection electrode ELT2 may be directly located on the first end portions EP1 of the second light emitting elements LD2 to come into contact with the first end portions EP1 of the second light emitting elements LD2. That is, the second connection electrode ELT2 may electrically connect the second end portions EP2 of the first light emitting elements LD1 and the first end portions EP1 of the second light emitting elements LD2.

Similarly, the third connection electrode ELT3 may be directly located on the second end portions EP2 of the second light emitting elements LD2 to come into contact with the second end portions EP2 of the second light emitting elements LD2. In addition, the third connection electrode ELT3 may be directly located on the first end portions EP1 of the third light emitting elements LD3 to come into contact with the first end portions EP1 of the third light emitting elements LD3. That is, the third connection electrode ELT3 may electrically connect the second end portions EP2 of the second light emitting elements LD2 and the first end portions EP1 of the third light emitting elements LD3.

Similarly, the fourth connection electrode ELT4 may be directly located on the second end portions EP2 of the third light emitting elements LD3 to come into contact with the second end portions EP2 of the third light emitting elements LD3. In addition, the fourth connection electrode ELT4 may be directly located on the first end portions EP1 of the fourth light emitting elements LD4 to come into contact with the first end portions EP1 of the fourth light emitting elements LD4. That is, the fourth connection electrode ELT4 may electrically connect the second end portions EP2 of the third light emitting elements LD3 and the first end portions EP1 of the fourth light emitting elements LD4.

Similarly, the fifth connection electrode ELT5 may be directly located on the second end portions EP2 of the fourth light emitting elements LD4 to come into contact with the second end portions EP2 of the fourth light emitting elements LD4.

The first connection electrode ELT1 may be electrically connected to the first transistor electrode TE1 of the transistor M through a contact hole passing through the insulating layer located under the first connection electrode ELT1. The fifth connection electrode ELT5 may be electrically connected to the third power conductive layer PL2c through a contact hole passing through the insulating layer located thereunder.

In one or more embodiments, the connection electrodes ELT may include the same conductive layer. For example, as illustrated in FIGS. 7 and 8, the first to fifth connection electrodes ELT1, ELT2, ELT3, ELT4, and ELT5 may be located on the same layer. As an example, the first to fifth connection electrodes ELT1, ELT2, ELT3, ELT4, and ELT5 may be concurrently or substantially simultaneously formed in the same process. As such, when the connection electrodes ELT are concurrently or substantially simultaneously formed, the number of masks may be reduced and the manufacturing process may be simplified.

In one or more other embodiments, the connection electrodes ELT may include a plurality of conductive layers. For example, as illustrated in FIGS. 9 and 10, the first connection electrode ELT1, the third connection electrode ELT3, and the fifth connection electrode ELT5 may be located on the same layer. In addition, the second connection electrode ELT2 and the fourth connection electrode ELT4 may be located on the same layer. The first connection electrode ELT1, the third connection electrode ELT3, and the fifth connection electrode ELT5 may be located on the fourth insulating layer INS4. A fifth insulating layer INS5 may be located on the first connection electrode ELT1, the third connection electrode ELT3, and the fifth connection electrode ELT5. The second connection electrode ELT2 and the fourth connection electrode ELT4 may be located on the fifth insulating layer INS5.

As such, when the fifth insulating layer INS5 is located between the connection electrodes ELT including different conductive layers, the connection electrodes ELT may be stably separated by the fifth insulating layer INS5, thereby securing electrical stability between the first and second end portions EP1 and EP2 of the light emitting elements LD.

The fifth insulating layer INS5 may include a single layer or multiple layers, and may include various types of inorganic materials, including silicon oxide $(SiO_x)$, silicon nitride $(SiN_x)$, silicon oxynitride $(SiO_xN_y)$, aluminum nitride $(AlN_x)$, aluminum oxide $(AlO_x)$, zirconium oxide $(ZrO_x)$, hafnium oxide $(HfO_x)$, or titanium oxide $(TiO_x)$.

The connection electrodes ELT may include various transparent conductive materials, respectively. Therefore, light emitted from the first and second end portions EP1 and EP2 of the light emitting elements LD may pass through the connection electrodes ELT and may be emitted to the outside of the display panel PNL.

Figure 12:
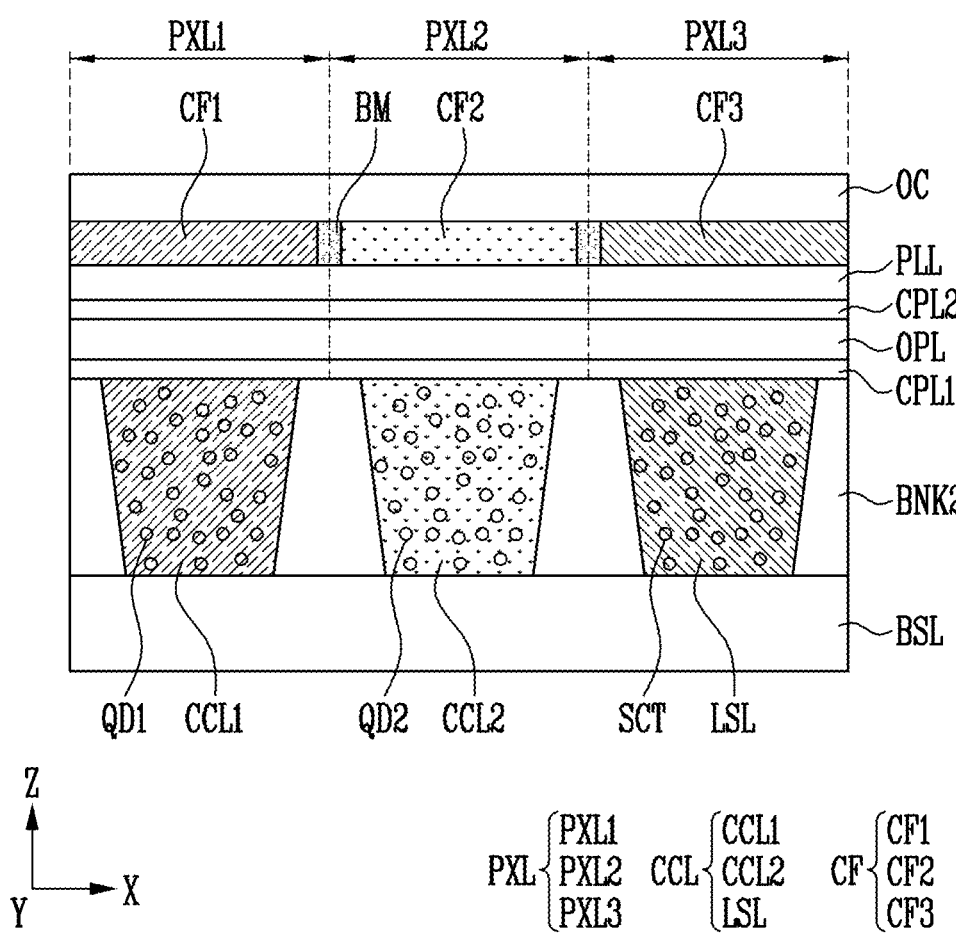
FIG. 12 is a cross-sectional view illustrating first to third pixels according to one or more embodiments.
Figure 13:
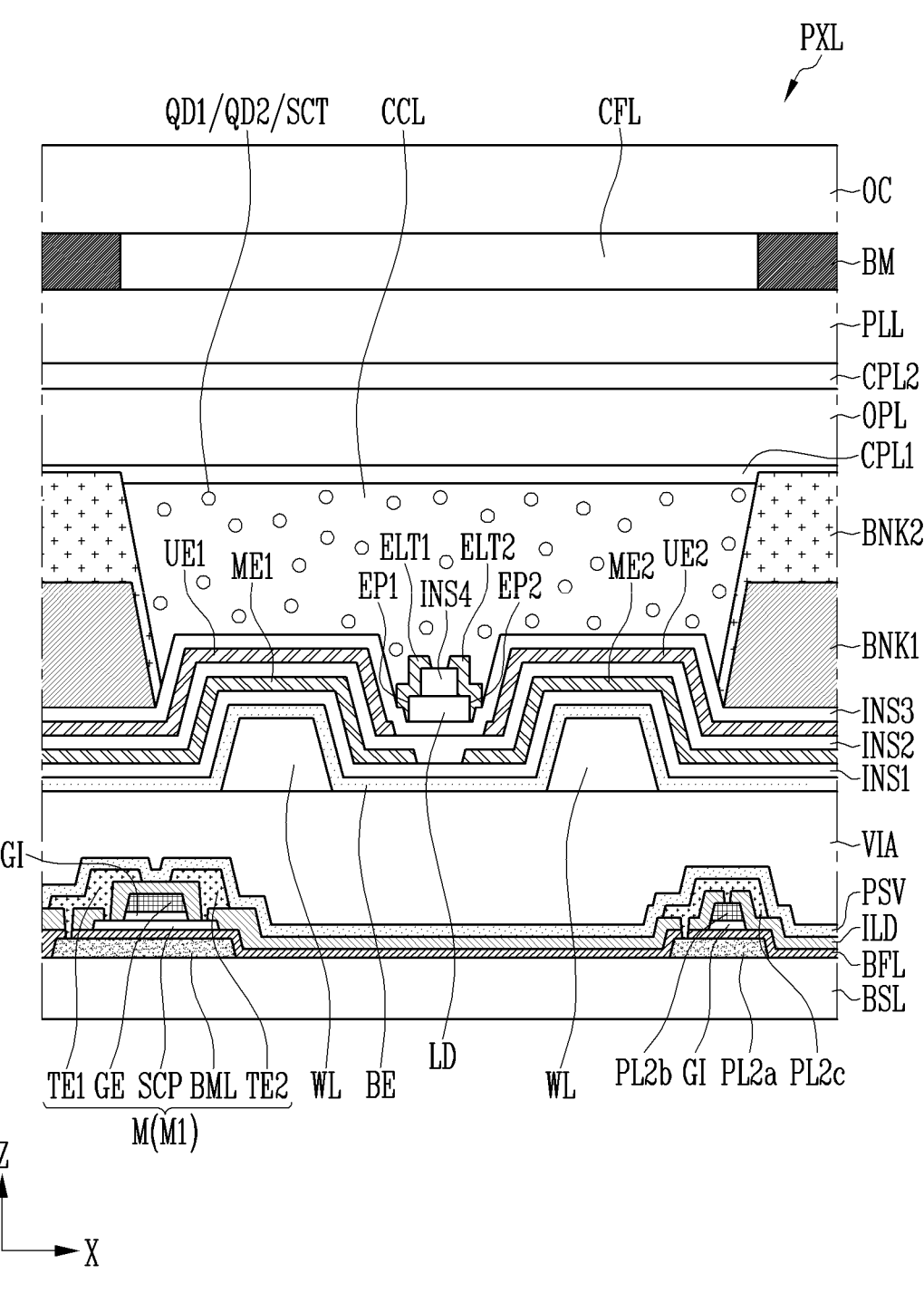
FIG. 13 is a cross-sectional view of a pixel according to one or more embodiments.

FIG. 12 is a cross-sectional view illustrating first to third pixels according to one or more embodiments. FIG. 13 is a cross-sectional view of a pixel according to one or more embodiments.

FIG. 12 illustrates a second bank BNK2, a color conversion layer CCL, an optical layer OPL, and/or a color filter layer CFL. In FIG. 12, elements other than the base layer BSL of FIGS. 7 to 10 are omitted for convenience of description. FIG. 13 is a detailed view of a stacked structure of a pixel PXL in relation to the second bank BNK2, the color conversion layer CCL, the optical layer OPL, and/or the color filter layer CFL.

Referring to FIGS. 12 and 13, the second bank BNK2 may be located between the first to third pixels PXL1, PXL2, and PXL3, or at the boundary therebetween, and may include/define an opening overlapping each of the first to third pixels PXL1, PXL2, and PXL3. The opening of the second bank BNK2 may provide a space in which the color conversion layer CCL may be provided. For example, a desired type and/or amount of the color conversion layer CCL may be supplied to the space partitioned by the opening of the second bank BNK2.

The second bank BNK2 may include an organic material, such as an acrylic resin, an epoxy resin, a phenolic resin, a polyamide resin, a polyimide resin, a polyester resin, a polyphenylenesulfide resin, or benzocyclobutene (BCB). However, the present disclosure is not necessarily limited thereto. The second bank BNK2 may include various types of inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

In some embodiments, the second bank BNK2 may include at least one light-blocking and/or reflective material. Therefore, light leakage between the adjacent pixels PXL may be reduced or prevented. For example, the second bank BNK2 may include a black pigment, but the present disclosure is not necessarily limited thereto.

The color conversion layer CCL may be located on the light emitting elements LD in the opening of the second bank BNK2. The color conversion layer CCL may include a first color conversion layer CCL1 located in the first pixel PXL1, a second color conversion layer CCL2 located in the second pixel PXL2, and a scattering layer LSL located in the third pixel PXL3.

In one or more embodiments, the first to third pixels PXL1, PXL2, and PXL3 may include light emitting elements LD that emit light of the same color as each other. For example, the first to third pixels PXL1, PXL2, and PXL3 may include light emitting elements LD that emit light of the third color (or the blue color). A full-color image may be displayed by placing the color conversion layer CCL including color conversion particles on the first to third pixels PXL1, PXL2, and PXL3, respectively.

The first color conversion layer CCL1 may include first color conversion particles that convert light of the third color emitted from the light emitting element LD into light of the first color. For example, the first color conversion layer CCL1 may include a plurality of first quantum dots QD1 dispersed in a matrix material (e.g., predetermined matrix material), such as a base resin.

In one or more embodiments, when the light emitting element LD is a blue light emitting element emitting blue light and the first pixel PXL1 is a red pixel, the first color conversion layer CCL1 may include a first quantum dot QD1 that converts blue light emitted from the blue light emitting element into red light. The first quantum dot QD1 may absorb blue light and may shift a wavelength according to an energy transition to emit red light. On the other hand, when the first pixel PXL1 is a pixel of a different color, the first color conversion layer CCL1 may include a first quantum dot QD1 corresponding to the color of the first pixel PXL1.

The second color conversion layer CCL2 may include second color conversion particles that convert light of the third color emitted from the light emitting element LD into light of the second color. For example, the second color conversion layer CCL2 may include a plurality of second quantum dots QD2 dispersed in a matrix material (e.g., predetermined matrix material), such as a base resin.

In one or more embodiments, when the light emitting element LD is a blue light emitting element emitting blue light and the second pixel PXL2 is a green pixel, the second color conversion layer CCL2 may include a second quantum dot QD2 that converts blue light emitted from the blue light emitting element into green light. The second quantum dot QD2 may absorb blue light and may shift a wavelength according to an energy transition to emit green light. On the other hand, when the second pixel PXL2 is a pixel of a different color, the second color conversion layer CCL2 may include a second quantum dot QD2 corresponding to the color of the second pixel PXL2.

In one or more embodiments, blue light having a relatively short wavelength in the visible light band is incident on the first quantum dot QD1 and the second quantum dot QD2 to increase absorption coefficients of the first quantum dot QD1 and the second quantum dot QD2. Therefore, the light efficiency finally emitted from the first pixel PXL1 and the second pixel PXL2 may be improved, and excellent color reproducibility may be secured. In addition, the emission unit EMU of the first to third pixels PXL1, PXL2, and PXL3 is formed by using the light emitting elements LD (e.g., blue light emitting elements) of the same color, thereby increasing the manufacturing efficiency of the display device.

The scattering layer LSL may be provided to efficiently use the light of the third color (or blue color) emitted from the light emitting element LD. For example, when the light emitting element LD is a blue light emitting element emitting blue light and the third pixel PXL3 is a blue pixel, the scattering layer LSL may include at least one type of scatterer SCT to efficiently use the light emitted from the light emitting element LD. For example, the scatterer SCT of the scattering layer LSL may include at least one selected from barium sulfate ($BaSO_4$), calcium carbonate ($CaCO_3$), titanium oxide ($TiO_2$), silicon oxide ($SiO_2$), aluminum oxide ($Al_2O_3$), and zinc oxide (ZnO). On the other hand, the scatterer SCT is not located only in the third pixel PXL3 and may be selectively included in the first color conversion layer CCL1 or the second color conversion layer CCL2. In some embodiments, the scatterer SCT may be omitted to provide the scattering layer LSL including a transparent polymer.

A first capping layer CPL1 may be located on the color conversion layer CCL. The first capping layer CPL1 may be provided over the first to third pixels PXL1, PXL2, and PXL3. The first capping layer CPL1 may cover the color conversion layer CCL. The first capping layer CPL1 may reduce or prevent impurities, such as moisture or air penetrating from the outside to damage or contaminate the color conversion layer CCL.

The first capping layer CPL1 is an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), or silicon oxynitride ($SiO_xN_y$).

The optical layer OPL may be located on the first capping layer CPL1. The optical layer OPL may improve light extraction efficiency by recycling light provided from the color conversion layer CCL by total reflection. To this end, the optical layer OPL may have a relatively low refractive index compared to the color conversion layer CCL. For example, the refractive index of the color conversion layer CCL may be about 1.6 to about 2.0, and the refractive index of the optical layer OPL may be about 1.1 to about 1.3.

A second capping layer CPL2 may be located on the optical layer OPL. The second capping layer CPL2 may be provided over the first to third pixels PXL1, PXL2, and PXL3. The second capping layer CPL2 may cover the optical layer OPL. The second capping layer CPL2 may reduce or prevent impurities, such as moisture or air penetrating from the outside to damage or contaminate the optical layer OPL.

The second capping layer CPL2 is an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), or silicon oxynitride ($SiO_xN_y$).

A planarization layer PLL may be located on the second capping layer CPL2. The planarization layer PLL may be provided over the first to third pixels PXL1, PXL2, and PXL3.

The planarization layer PLL may include an organic material, such as an acrylic resin, an epoxy resin, a phenolic resin, a polyamide resin, a polyimide resin, a polyester resin, a polyphenylenesulfide resin, or benzocyclobutene (BCB). However, the present disclosure is not necessarily limited thereto. The planarization layer PLL may include various types of inorganic materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The color filter layer CFL may be located on the planarization layer PLL. The color filter layer CFL may include color filters CF1, CF2, and CF3 matching the color of each pixel PXL. The color filters CF1, CF2, and CF3 corresponding to the colors of the first to third pixels PXL1, PXL2, and PXL3 may be located to display a full-color image.

The color filter layer CFL may include a first color filter CF1 located in the first pixel PXL1 to selectively transmit light emitted from the first pixel PXL1, a second color filter CF2 located in the second pixel PXL2 to selectively transmit light emitted from the second pixel PXL2, and a third color filter CF3 located in the third pixel PXL3 to selectively transmit light emitted from the third pixel PXL3.

In one or more embodiments, the first color filter CF1, the second color filter CF2, and the third color filter CF3 may be a red color filter, a green color filter, and a blue color filter, respectively. However, the present disclosure is not necessarily limited thereto. Hereinafter, any color filter among the first color filter CF1, the second color filter CF2, and the third color filter CF3 may be referred to as a "color filter CF," and two or more types of color filters may be referred to as "color filters CF."

The first color filter CF1 may overlap the first color conversion layer CCL1 in the third direction (Z-axis direction). The first color filter CF1 may include a color filter material that selectively transmits light of the first color (or red color). For example, when the first pixel PXL1 is a red pixel, the first color filter CF1 may include a red color filter material.

The second color filter CF2 may overlap the second color conversion layer CCL2 in the third direction (Z-axis direction). The second color filter CF2 may include a color filter material that selectively transmits light of the second color (or green color). For example, when the second pixel PXL2 is a green pixel, the second color filter CF2 may include a green color filter material.

The third color filter CF3 may overlap the scattering layer LSL in the third direction (Z-axis direction). The third color filter CF3 may include a color filter material that selectively transmits light of a third color (or blue color). For example, when the third pixel PXL3 is a blue pixel, the third color filter CF3 may include a blue color filter material.

In some embodiments, a light-blocking layer BM may be further located between the first to third color filters CF1, CF2, and CF3. As such, when the light-blocking layer BM is formed between the first to third color filters CF1, CF2, and CF3, color mixing defects recognized from the front or side surfaces of the display device may be reduced or prevented. A material of the light-blocking layer BM is not particularly limited, and may include various light-blocking materials. For example, the light-blocking layer BM may be implemented by stacking the first to third color filters CF1, CF2, and CF3 on each other.

An overcoat layer OC may be located on the color filter layer CFL. The overcoat layer OC may be provided over the first to third pixels PXL1, PXL2, and PXL3. The overcoat layer OC may cover a lower member including the color filter layer CFL. The overcoat layer OC may reduce or prevent moisture or air penetrating into the above-described lower member. In addition, the overcoat layer OC may protect the above-described lower member from foreign material, such as dust.

The overcoat layer OC may include an organic material, such as an acrylic resin, an epoxy resin, a phenolic resin, a polyamide resin, a polyimide resin, a polyester resin, a polyphenylenesulfide resin, or benzocyclobutene (BCB). However, the present disclosure is not necessarily limited thereto, and the overcoat layer OC may include various types of inorganic materials, such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

According to the above-described embodiments, the alignment efficiency of the light emitting elements LD may be improved by concurrently or substantially simultaneously utilizing the vertical electric field and the horizontal electric field using the lower electrode BE, the middle electrode ME, and/or the upper electrode UE.

Effects according to the embodiments are not limited by the above description presented above, and more various effects are incorporated in the present specification.

It will be understood that those of ordinary skill in the art can modify the present disclosure without departing from the essential features of the above description. Therefore, the disclosed methods are to be considered in an illustrative sense rather than a restrictive sense. The scope of the present disclosure is indicated in the claims rather than the foregoing description, and all differences within the scope equivalent thereto should be construed as falling within the present disclosure.

What is claimed is:

1. A display device comprising:
a lower electrode;
middle electrodes above the lower electrode, and spaced apart from each other;
upper electrodes above and overlapping the middle electrodes in a thickness direction with a second insulating layer therebetween, and spaced apart from each other;
light emitting elements between the upper electrodes; and
connection electrodes above the light emitting elements, and electrically connected to the light emitting elements.

2. The display device of claim 1, wherein an interval between the middle electrodes is less than a length of the light emitting elements.

3. The display device of claim 1, wherein an interval between the upper electrodes is greater than a length of the light emitting elements.

4. The display device of claim 1, wherein the light emitting elements completely overlap the lower electrode in the thickness direction.

5. The display device of claim 1, further comprising a first insulating layer between the lower electrode and the middle electrodes.

6. The display device of claim 1, further comprising a third insulating layer above the upper electrodes.

7. The display device of claim 6, wherein the light emitting elements are above the third insulating layer.

8. The display device of claim 1, further comprising a fourth insulating layer above the light emitting elements.

9. The display device of claim 8, wherein the connection electrodes are above end portions of the light emitting elements exposed by the fourth insulating layer.

10. The display device of claim 1, wherein an interval between the upper electrodes is greater than an interval between the middle electrodes.

\* \* \* \* \*